US006991887B1

(12) United States Patent
Grate et al.

(10) Patent No.: US 6,991,887 B1
(45) Date of Patent: Jan. 31, 2006

(54) PHOTOPATTERNABLE SORBENT AND FUNCTIONALIZED FILMS

(75) Inventors: Jay W. Grate, West Richland, WA (US); David A. Nelson, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

(21) Appl. No.: 09/703,755

(22) Filed: Nov. 1, 2000

(51) Int. Cl.
 G03F 7/038 (2006.01)
 G03F 7/027 (2006.01)
 G03F 7/20 (2006.01)
 G03F 7/30 (2006.01)
 C08J 3/28 (2006.01)

(52) U.S. Cl. .............. 430/270.1; 430/325; 522/99; 522/148; 522/172; 427/515

(58) Field of Classification Search ............ 522/99; 427/510, 515; 430/286.1, 288.1, 325, 320, 430/321, 270.1
See application file for complete search history.

(56) References Cited

U.S. PATENT DOCUMENTS

| 4,243,718 A | * | 1/1981 | Murai et al. ............... 428/411 |
| 4,939,065 A | * | 7/1990 | Cavezzan et al. ............ 430/167 |
| 5,145,886 A | * | 9/1992 | Oxman et al. ............... 522/66 |
| 5,262,192 A | * | 11/1993 | Nelson et al. ............... 427/2 |
| 5,470,693 A | * | 11/1995 | Sachdev et al. ............ 430/315 |
| 5,607,645 A | * | 3/1997 | Bentsen et al. .......... 422/82.07 |
| 6,015,869 A | | 1/2000 | Grate et al. ................. 528/15 |
| 6,083,661 A | * | 7/2000 | Oaks et al. ............... 430/286.1 |
| 6,271,309 B1 | | 8/2001 | Roberts et al. ............ 525/106 |
| 6,289,841 B1 | | 9/2001 | Caldwell ................... 118/33 |

FOREIGN PATENT DOCUMENTS

| WO | WO 92/10529 | 6/1992 |
| WO | WO 92/10544 | 6/1992 |

OTHER PUBLICATIONS

Platinum (II) Bis(B-diketonates) as Photoacativated Hydrosilation Catalysts—Frederck D. Lewis and Gwen D. Salvi—Sep. 8, 1994.
Rapid Photoactived Hydrosilation Polymerization of Vinyldimethylsilane by Bryan E. Fry and D. C. Neckers, Feb. 6, 1996.
Photoactivated hydrosilation curing of a ceramic precursor: crosslinking and pyrolysis of branched oligo by: Bryan E. Fry, Andrew Guo, D. C. Neckers, Oct. 3, 1996.
Highly Active Visibile-Light Photocatalysts for Curing a Ceramic Precursor—Andrew Guo, Bryan E. Fry and D. C. Neckers, Jul. 22, 1997.

* cited by examiner

Primary Examiner—Sin Lee
(74) Attorney, Agent, or Firm—Woodard, Emhardt, Moriarty, McNett & Henry LLP

(57) ABSTRACT

A composition containing a polymer, a crosslinker and a photo-activatable catalyst is placed on a substrate. The composition is exposed to a predetermined pattern of light, leaving an unexposed region. The light causes the polymer to become crosslinked by hydrosilylation. A solvent is used to remove the unexposed composition from the substrate, leaving the exposed pattern to become a sorbent polymer film that will absorb a predetermined chemical species when exposed to such chemical species.

96 Claims, 16 Drawing Sheets

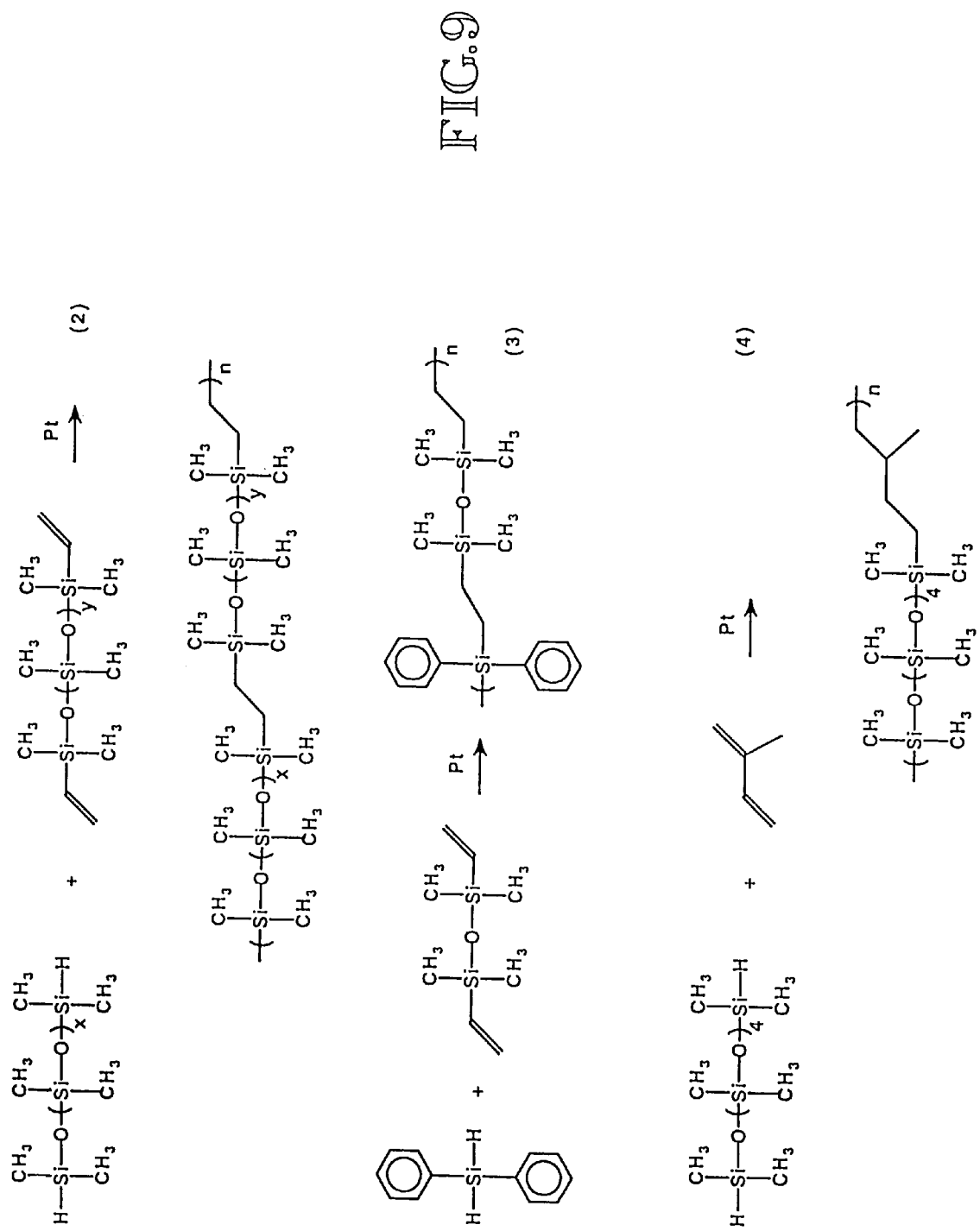

Strong hydrogen bond acid
BSP3, x=1
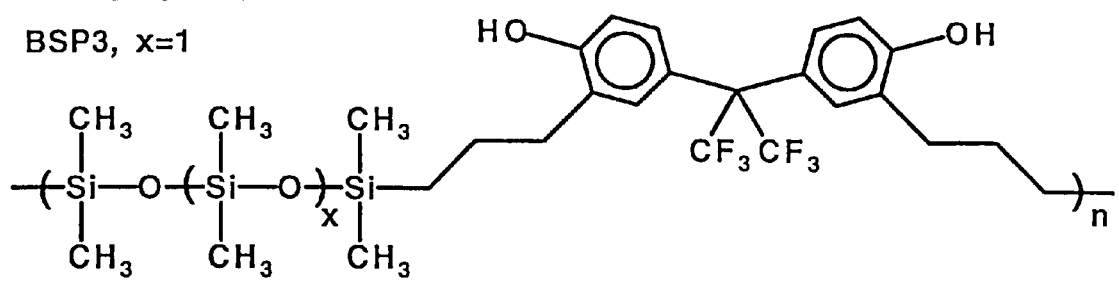
Strong base, very dipolar
UR3
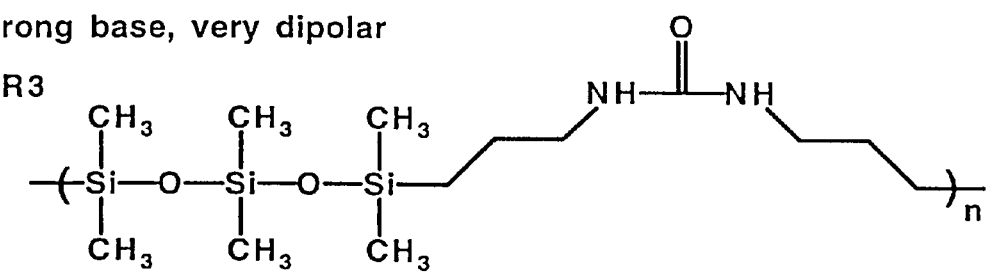
Polarizable
CSPH
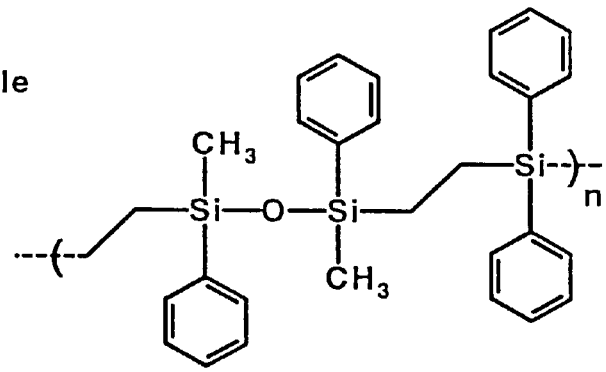
Nonpolar
CSME
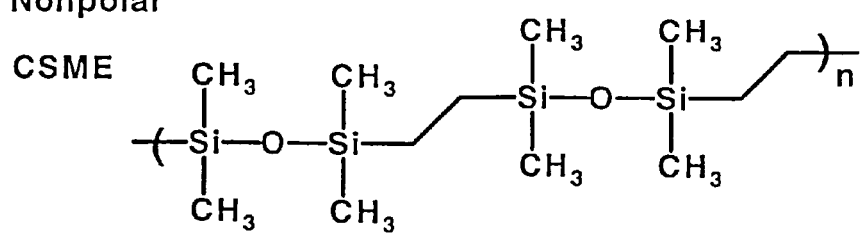
FIG. 10

FPW Array-on-a-Chip

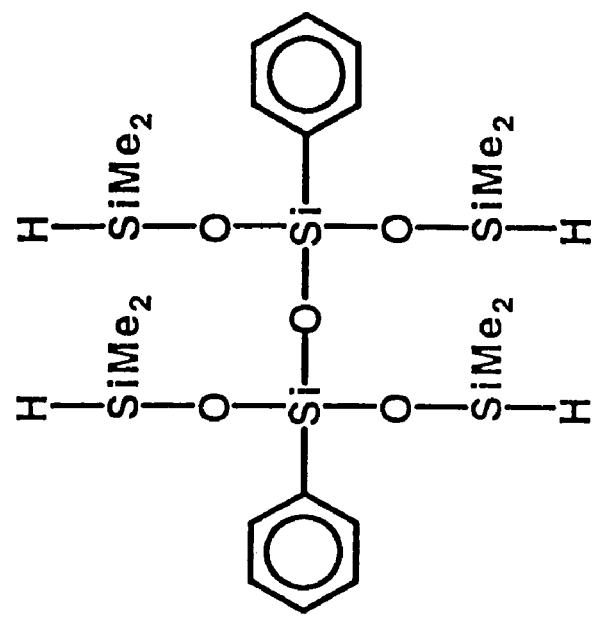
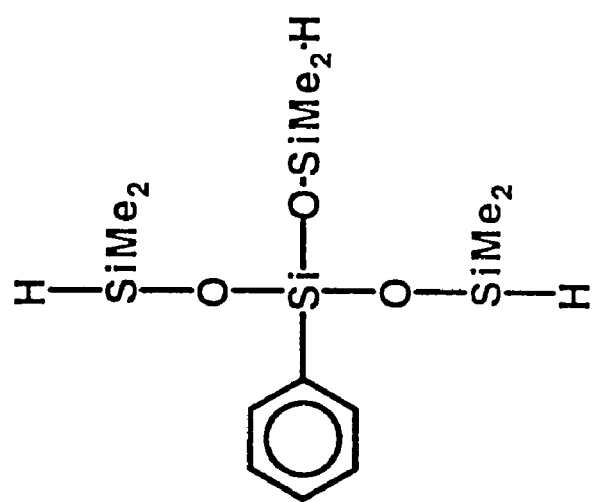
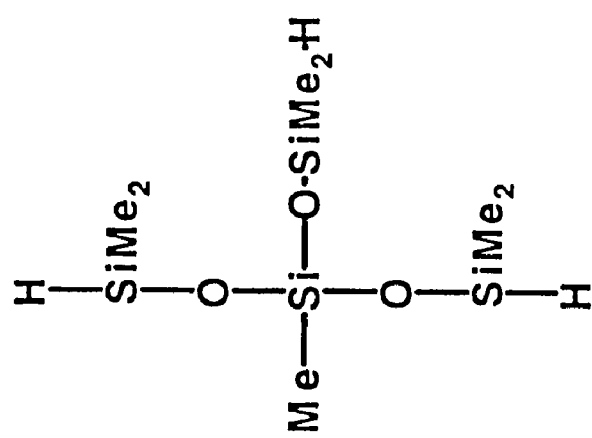
FIG. 15

Synthesis
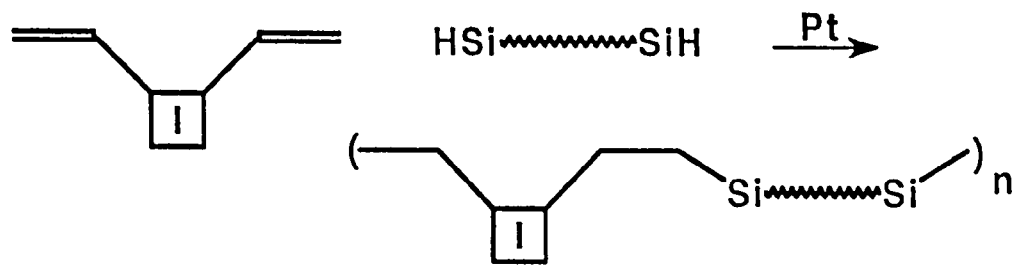
Crosslinking
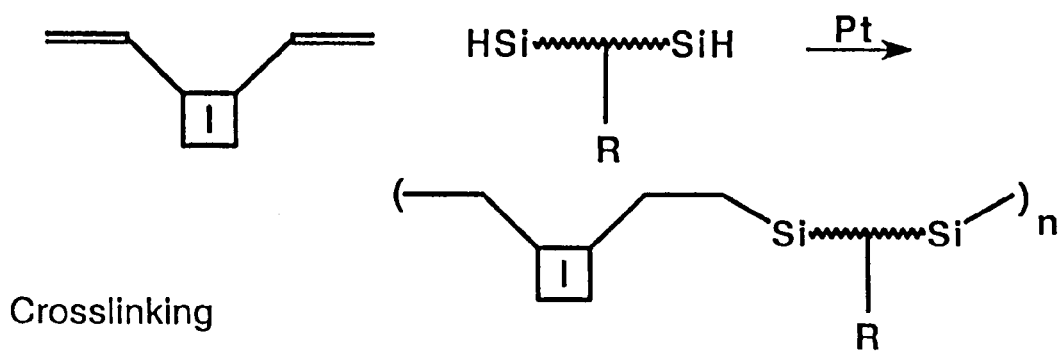
Grafting
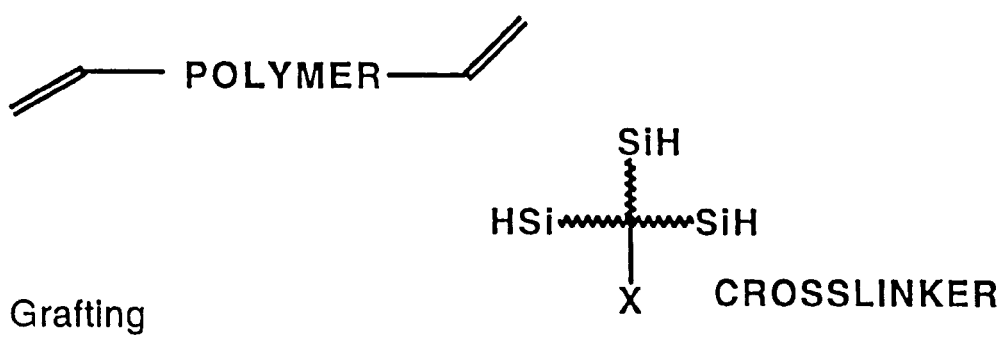
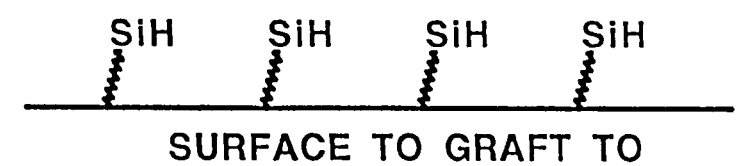
FIG. 16

PHOTOPATTERNABLE SORBENT AND FUNCTIONALIZED FILMS

This invention was made with Government support under Contract DE-AC0676RLO1830 awarded by the U.S. Department of Energy. The Government has certain right in the invention.

TECHNICAL FIELD

This invention relates to methods of making, grafting to surfaces, and photopatterning sorbent and functionalized films using hydrosilylation chemistry. It also relates to the films and devices, e.g. chemical sensors, utilizing the films.

BACKGROUND OF THE INVENTION

Herein the term "photopatternable film" refers to materials that can be patterned onto localized domains on a surface through the use of a light to alter the material properties. Exposure to light initiates processes that create a difference in the solubility of the material between those domains that have been exposed to light and those domains that have not be exposed to light. After exposing selected domains to light, solvents are used to remove either those domains not exposed to light, leaving patterned localized areas consisting of those domains that were exposed to light; or alternatively, the material may have been designed so that the domains exposed to light are removed through solvent action while those domains not exposed to light remain. The solvent action is used to develop the pattern in the film that was uniform prior to exposure to light.

The term "sorbent film means films made from a material that will absorb chemical species that diffuse through the film material upon exposure to those species.

The term "functionalized means that the film has interactive properties due to chemical structural units in the film, and these interactive properties make the film suitable for particular applications, e.g. microanalytical materials and devices such as chemical sensors.

The term "chemically selective" means that the film will absorb some chemical species more than other chemical species, and thus be selective for those species that are more strongly absorbed. Chemical selectivity is important in the suitability of the film for particular applications, e.g. microanalytical applications such as chemical sensors.

A precusor molecule may be a monomer, an oligomer, a polymer, or a crosslinker that is incorporated in the composition.

Chemically selective sorbent films can be designed to be selective for some species relative to others through the incorporation of chemical structural units that provide articular interactive properties.

There exists a need for chemically interactive sorbent materials and formulations that can be patterned on devices and structures. There is also a need for a method to provide sorbent materials that have a specific chemical interactions required for their microanalytical function in their particular applications and which can be patterned on device structures. There is further a need to be able to create a variety of such materials and formulations so that each has different chemically interactive properties but each can be patterned into localized domains on device structures.

A principal object of the present invention is to use hydrosilylation chemistry to crosslink polymeric films where they have been exposed to light. The crosslinked areas then have different solubility in developing solvents than do uncrosslinked areas. The developing solvent is used to remove the unexposed, uncrosslinked regions of the film, leaving the exposed, crosslinked regions of the film. Hydrosilylation chemistry is useful for this purpose because it is selective. A variety of materials can be crosslinked by use of this chemistry while leaving other chemical materials unaffected. Another object of the invention is to use hydrosilylation chemistry to convert monomers and oligomers to polymeric films where they have been exposed to light. Another object is to crosslink the polymeric film as it is forming from the monomers and oligomers provided in the film composition.

Another object of the invention is to graft the sorbent film onto a surface at the same time that it is crosslinked and/or polymerized. An object of the invention is to use a hydrosilylation catalyst that is inactive until it is exposed to light. Once it is activated by light, it initiates hydrosilylation reactions within the film that polymerize, crosslink and/or graft the film. A further object of the invention is to use polymer or prepolymer formulations on surfaces that have been modified so that grafting can occur and to use the catalyst to also initiate the grafting process. A further object of the invention is develop combinations of precursor molecules that, when incorporated into the composition and exposed to light of a type and in a sufficient amount, will react by hydrosilylation to create a sorbent film that will selectively absorb chemical species when exposed to those chemical species. It is necessary that the precursor molecules be miscible in order to react in the composition. Therefore it is an object of the invention to prepare combinations of precursor molecules that are miscible and will react to create the chemically selective sorbent film. It is a further object of the invention to combine a functionalized monomer with an oligomer that is derived from the same monomer. This approach where both the monomer and the oligomer are derived from the same molecule assures that these two precursor molecules will be miscible with one another in a film. Thus a monomer with two carbon—carbon multiple bonds may be combined with an oligomer derived from the reaction of the same monomer with an excess of an alpha,omega-dihydrooligodimethylsiloxane to create an oligomer that contains the monomer and which is terminated in silicon hydride bonds.

The following patents and publications should be carefully considered for the purpose of putting the present invention into proper perspective relative to the prior art: U.S. Pat. No. 5,145,886, granted Sep. 8, 1992, to Joel D. Oxman and Larry D. Boardman; U.S. Pat. No. 6,015,869, granted Jan. 18, 2000, to Jay W. Grate and Steven N. Kaganove; PCT Application No. WO 92/10529, filed by the Minnesota Mining And Manufacturing Company, U.S.A., and published on Jun. 25, 1992; PCT Application No. WO 92/10544, filed by Minnesota Mining And Manufacturing Company, and published on Jun. 25, 1992; and publication: Fredrick. D. Lewis and Gwen D. Salvi, "Platinum (II) Bis($\beta$-diketonates) as Photoactivated Hydrosilation Catalysts, Inorganic Chemistry", 1995, 34, 3182–3189; Bryan E. Fry and D. C. Neckers, "Rapid Photoactivated Hydrosilation Polymerization of Vinyldimethlysilane", Macromolecules 1996, 29, 5306–5312; Bryan E. Fry, Andrew Guo, D. C. Neckers, "Photoactivated Hydrosilation Curing of a Ceramic Precursor: Crosslinking and Pyrolysis of branched oligo [(methylsilylene)methylene], Journal of Organiometallic Chemistry 538 (1997), 151–161; and Andrew Guo, Bryan E. Fry and Douglas C. Neckeres, "Highly Active Visible-Light Photo-catalysts for Curing a Ceramic Precursor", Chemistry Materials, 1998, 10, 531–536.

BRIEF SUMMARY OF THE INVENTION

The present invention includes a method of forming a sorbent film that will selectively absorb chemical species when it is exposed to such species. The method comprises placing on a substrate a composition containing a first precursor molecule containing at least two silicon hydride groups, a second precursor molecule containing at least two carbon—carbon multiple bonds, and a photoactivatable catalyst. At least a portion of this composition is exposed to light of a type and in an amount sufficient to cause hydrosilylation reactions to occur in the composition where it is exposed to the light.

Another method aspect of the invention comprises exposing the composition to a predetermined pattern of light, leaving an unexposed region. Then a solvent is used to remove the unexposed composition from the substrate, leaving the exposed pattern to become a sorbent polymer film that will selectively absorb chemical species when it is exposed to such chemical species. Another method aspect of the invention involves pretreating the substrate surface with a coupling agent that modifies the surface so that is has groups that can participate in hydrosilylation reactions with a subsequently applied film composition. For example, the surface may be modified so that is contains covalently bound silicon hydride groups or covalently bound carbon—carbon multiple bonds. Coupling agents such as triethoxyilane and triethoxyvinylsilane are suitable coupling agents, although many others are known in the art, including but not limited to coupling agents selected from the group trialkoxysilanes, trimethoxysilane, triethoxysilane, trichlorosilane, trialkoxyvinylsilanes, trimethoxyvinylsilane, triethoxyvinylsilane, trichlorovinylsilane, alkoxydimethylsilanes, chlorodimethylsilanes, alkoxydimethylvinylsilanes, and chlorodimethylvinylsilanes. A composition containing a first precursor molecule containing at least two silicon hydride groups, a second precursor molecule containing at least two carbon—carbon multiple bonds, and a photoactivatable catalyst is placed on the modified surface and at least a portion of the composition is exposed to light of a type and in an amount sufficient to initiate hydrosilylation reactions. These reactions graft the film material to the surface by creating covalent silicon-carbon bonds between the film material and the surface groups. These grafting reactions occur at the same time as polymerization and crosslinking reactions within the film material. These result in chemically selective sorbent films on the surface that will selectively absorb chemical species when exposed to such chemical species.

Yet another method aspect of the invention is to use composition comprising phenyl-substituted polysiloxane (50% phenyl, 1% random vinyl); 1,3-diphenyl-1,1,3-3-tetrakis (dimethylsiloxy) disiloxane, cyano-substituted polysiloxane (cyanopropymethil-phenylsiloxan) and 1% random vinyl, 1,3-diphenyl-1,1,3-3-tetrakis(dimethylsiloxy) disiloxane, Bisphenol-A containing monomer with ally (groups: 2,2,2-bis(3-allyl-4-hydroxyphenyl)hexafluoroprane)(3-allyl, 4-hydroxphenyl) hexafluoro-propane terminated with hexamethyltrisiloxane; 1,3-diphenyl-1,3,3-tetrakis(dimethylsiloxy) disiloxane.

Another method aspect of the invention comprises using a composition containing effective amounts of phenyl-substituted polysiloxane (50% phenyl, 1% random vinyl), 1,3-diphenyl-1,1,3-3-tetrakis(dimethylsiloxy)disiloxane and a photo-activatable catalyst.

Another aspect of the invention is to use the composition that contains effective amounts of cyano-substituted polysiloxane (cyanopropymethil-phenylsiloxane) and 1% random vinyl, 1,3-diphenyl-1,1,3,3-tetrakis(dimethylsiloxy)disiloxane and a photo-activatable catalyst.

Yet another method aspect of the invention involves use of a composition containing "effective amounts of hexafluorobisphenol-A containing monomer with two allyl groups, (2,2-bis(3-allyl-4-hydroxyphenyl)hexafluoropropane, an silicon hydride terminated oligomer prepared from the same bisphenol in a reaction with hexamethyltrisiloxane, 1,3-diphenyl-1,1,3,3-tetrakis(dimethylsiloxy)disiloxane, and a photoactivatable catalyst.

The present invention also includes the sorbent polymer films made by the methods and chemical sensors made by the methods.

Other objects, advantages and features of the invention will become apparent from the description of the best mode set forth below, from the drawings, from the claims and from the principles that are embodied in the specific structures that are illustrated and described.

BRIEF DESCRIPTION OF THE SEVERAL VIEWS OF THE DRAWING

Like reference numerals are used to designate like parts throughout the several views of the drawing, and:

FIG. 9 illustrates three polymerization reactions;

FIG. 10 illustrates four sorbent and functionalized polymers that have been prepared using hydrosilylation chemistry;

FIG. 15 shows multifunctional crosslinkers that in the presence of a platinum catalyst will yield a formulation that will crosslink on curing;

FIG. 16 shows aspects of the overall scheme for polymer synthesis, crosslinking, and grafting of carbosiloxane polymers. Note that polymers may also be terminated in silicon hydride bonds rather than carbon—carbon multiple bonds, and that the crosslinker and surface may contain carbon—carbon multiple bonds rather than silicon hydride bonds.

DETAILED DESCRIPTION OF THE INVENTION

Figure 7:
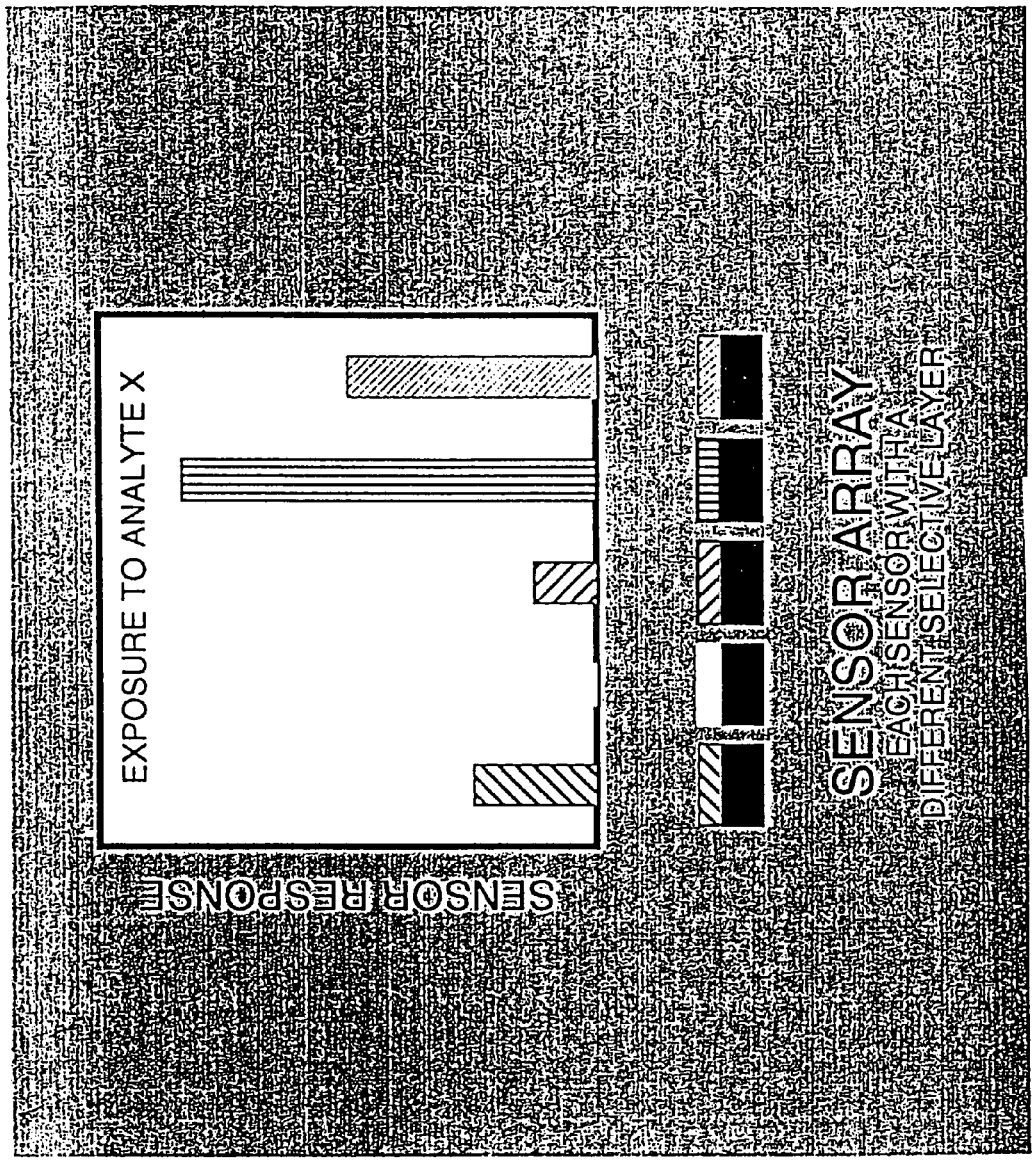
FIG. 7 illustrates the concept of several sensors, each with a different sensor coating, giving rise to variable responses to an analyte that appears as a pattern in bar graph format.

Sorbent and functionalized polymers play a key role in a diverse set of fields, including chemical sensors, separation membranes, solid phase extraction techniques, and chromatography. Sorbent polymers are critical role to a number of sensor array or "electronic nose" systems. The responses of the sensors in the array give rise to patterns that can be used to distinguish one compound from another, provided that a sufficiently diverse set of sensing materials is present in the array. FIG. 7 illustrates the concept of several sensors, each with a different sensor coating, giving rise to variable responses to an analyte that appear as a pattern in bar graph format. Using hydrosilylation as the bond-forming reaction, we have developed a versatile and efficient approach to developing sorbent polymers with diverse interactive properties for sensor applications. Both the chemical and physical properties of these polymers are predictable and tunable by design.

Many types of sensor devices can and have been used in sensor arrays for gas phase vapor detection. These arrays involve diverse interactive coatings on multiple sensors with the resulting multivariate data analyzed by pattern recognition techniques. Array detectors are sometimes referred to as electronic noses because the nose uses multiple receptors whose signals are processed by neuronal pattern recognition processes. Some of the most well-known examples of gas phase sensor arrays employ polymers as the interactive coatings.

Arrays based on acoustic wave sensors use quartz crystal microbalance (QCM), surface acoustic wave device (SAW), or the flexural plate wave (FPW) devices as the sensing transducers. Signals are generated that are proportional to the mass of the vapor sorbed by each of the polymer coatings on the device surfaces. The observed signals may also include a polymer modulus change contribution.

Vapor sorption by sorbent polymers can also be transduced using chemiresistor configurations were the insulating polymer is loaded with (typically) 20% of carbon black particles. Vapor sorption swells the insulating polymer and increases the resistance through the polymer/carbon black composite. These types of chemiresistor sensors have served as the basis of sensor arrays.

Alternatively, sorbent polymers may serve as the matrix for fluorescent dyes such as Nile Red. Vapor sorption alters the fluorescence signal from the incorporated dye molecules. Arrays have been prepared with various dyes in various polymers on the ends of fiber optic bundles.

Polymers are useful materials for chemical vapor sensing for several reasons, including their ability to collect and concentrate vapor molecules on sensor surfaces by reversible sorption; their suitability for application on devices as thin adherent films; and the fact that chemical selectivity is determined by chemical structure, which can be easily varied through synthesis. Polymers can yield sensors with rapid, reversible, and reproducible responses. In addition, diverse sets of polymers can be assembled for use in sensor arrays, providing the variable selectivity across the array that is required for obtaining useful chemical information for pattern recognition analysis.

The chemically interactive properties of polymers for chemical vapor sensing have been systematically examined using linear salvation energy relationships (LSERs). These linear free energy relationships model the sorption of vapors by polymers in terms of fundamental interactions such as dispersion interactions, interactions involving dipoles and induced dipoles, and hydrogen-bonding interactions. Models derived by this approach can be used for prediction and understanding, the latter usually being the most important. The role of fundamental vapor/polymer interactions and LSERs for designing sensor arrays was first set out in detail in 1991. Subsequent treatments have demonstrated applicability to many related aspects of chemical sensor development. Sensor array design for detection of organic vapors entails the selection of a set of polymers where each emphasizes a different interaction, leading to requirements for polymers that are nonpolar, polarizable, dipolar, hydrogen-bond basic, and hydrogen-bond acidic.

However, having the required chemically interactive properties alone is not sufficient for a polymer to be useful in chemical sensing. A sensing polymer must also have a number of desirable physical properties. Rapid chemical sensor responses, which are usually desirable, are promoted by polymers with glass-to-rubber transition temperatures below the operating temperature of the sensor. Vapor diffusion in and out of polymers is rapid under these conditions. Response times of sensors with glassy polymers are typically much slower than those based on rubbery polymers. The method by which the material will be applied to a chemical sensor as a thin film may also impose requirements on the polymer or pre-polymer formulation. For example, solubility in organic solvents may be necessary, or a certain viscosity for a prepolymer may be necessary as part of a coating process. Particular sensor platforms may impose their own requirements, such as refractive index requirements for an optical sensor. Therefore, the synthesis of a polymer for a sensor or sensor array application must consider not only the chemical interactions, which have been studied in detail, but also the desired physical properties for film application and sensor performance.

Given the multiplicity of performance criteria for optimized sensing polymers, it would be useful to have a single synthetic approach that would be versatile enough to yield individual polymers that combine desirable chemical physical properties, and also able to create diverse sets of such materials for various applications and arrays. In this way, each new sensing material would not present a new and unique synthesis problem. In addition, it would be desirable to be able to tune and formulate these polymers for various types of sensor devices, each of which may impose different requirements on physical properties and thin film deposition methods.

Figure 8:
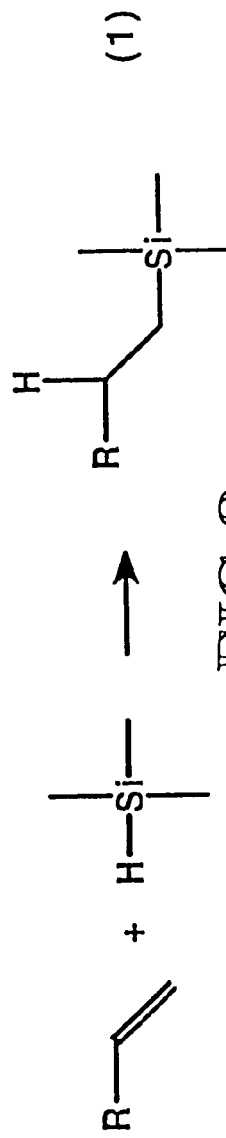
FIG. 8 is a diagram of a hydrosilylation reaction involving the formation of a silicon-carbon (SidC) bond by the addition of a silicon hydrided (Si—H) bond across a carbon—carbon double bond in the presence of a noble metal catalyst such as Pt.

With these considerations in mind, we have explored the use of hydrosilylation reaction involves the formation of a silicon-carbon (Si—C) bond by the addition of a silicon hydrided (Si—H) bond across a carbon—carton double bond in the presence of a noble metal catalyst such as Pt. See equation FIG. 8. Linear polymers with alternating monomers can be formed when one monomer, has two carbon—carton double bonds and the second monomer has two silicon hydride groups. Three such polymerization reactions are shown in FIG. 9. Typically, the monomer with two silicon hydride groups is an α, ω-dihydroorganosiloxane, although it could also be a monomer such as diphenylsilane.

The monomer with two carbon—carbon double bonds may also be an oligosiloxane or an organic diene. Polymers combining siloxy linkages and carbon—carbon bonds in the polymer backbone are called carbosiloxane polymers. When the monomer with two carbon—carbon bonds is an organic compound and the second monomer is an α, ω-dihydroorganosiloxane, hybrid organic-inorganic polymers result.

In most of the original examples of hydrosilylation polymerization, the substituents on silicon were typically methyl, ethyl, or phenyl, and hexachloroplatinic acid was used as the catalyst. The reaction of isoprene with α, ω-dihydrododecamethylhexasiloxane was an early example of an organic/inorganic material prepared by hydrosilylation polymerization. (See FIG. 9). Despite the fact that the use of they hydrosilylation reaction for polymerization was demonstrated over 35 years ago, it was noted as recently as 1993 that "the direct use of the hydrosilylation reaction in preparation of organosilicic polymers has been limited so far". Furthermore, it was noted in 1994 that early studies on the use of hydrosilylation polymerization "resulted only in low molecular weight oligomeric products" and indicated that the "versatile reaction has not been successfully developed for the synthesis of truly high molecular weight linear polymers." It has been demonstrated that "truly high molecular weight polymers" methyl-substituted polymers could be obtained by this reaction using Pt divinyltetramethyldisiloxane catalyst rather than hexachloroplatinic acid.

The question can be asked, "Why synthesize sensing polymers?" The answer is: (1) to put rational design principles to work in sensor material development, (2) to prepare materials with selectivities that are not available in commercial polymers, (3) to overcome shortcomings in the performance of commercial polymers as layers on sensor, (4) to obtain rigorous control over composition and properties, (5) to prepare materials that combine the desired chemically interactive properties with necessary physical properties for performance as thin films on sensors, (6) to prepare polymers and prepolymers that can be crosslinked and/or grafted to surfaces, and (7) to prepare and adapt polymer and prepolymer formulations for application as sensing thin films on various sensing platforms.

The following will focus on development of polymers and polymer thin films for chemical sensors and arrays using hydrosilylation chemistry:

The hydrosilylation polymerization method is capable of incorporating a variety of organic structures and functional groups into a polymeric structure. The hydrosilylation reaction is selective and tolerates many functional groups including esters, nitrites, amines, amides, nitro, ketone, ether, phosphate, sulfide, and sulfones, to name just a few. In addition, it is well known that oligosiloxane segments in polymers often lead to low glass-to-rubber transition temperatures. Therefore, this polymerization approach meets two primary criteria for the synthesis of chemical sensing polymers: diverse polymers with various functional groups can be prepared, and the polymers can be prepared with low glass-to-rubber transition temperatures. Functional groups can be selected to obtain the vapor/polymer interactions discussed above. The length of the oligodimethylsiloxane can be varied to influence glass transition temperature and other physical properties.

The approach also has a number of other desirable features. The bond forming reaction produces silicon-carbon bonds and does not introduce any polar functionalities into the final material. Thus, the bond forming reaction itself does not "bias" the selectivity of the resulting polymers, as would be the case if all polymers were formed by amide or ester linkages, for example. The method allows control of end group functionality. Polymers or oligomers may be terminated with primarily carbon—carbon double bonds or silicon hydride bonds, which may be useful for subsequent crosslinking of a polymer film (see below). Alternatively, the reactivity of the chain ends could be used for endcapping with specific molecules or functionalities. In addition, the method can be adapted to deliberately produce oligomers rather than polymers when the ratio of monomers in not 1:1. Thus, this polymerization approach provides the opportunity to tune molecular weight distribution for polymer or prepolymer formulations.

Figure 11:
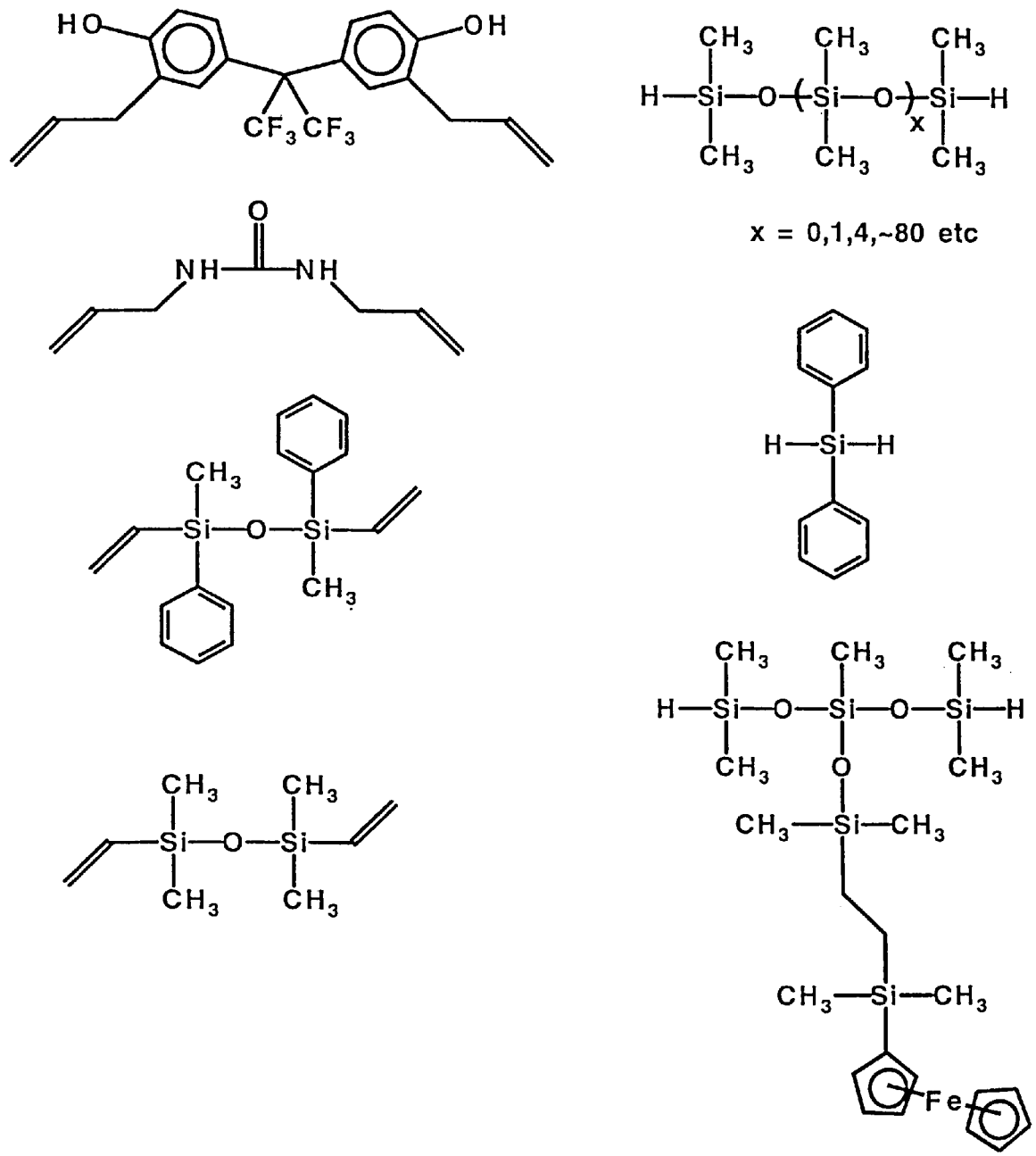
FIG. 11 shows some of the monomers used in the preparation of the polymers shown in FIG. 10 and other polymers.

FIG. 10 illustrates four of the sorbent and functionalized polymers that we have prepared by this method. Some of the monomers used in the preparation of these and other polymers are shown in FIG. 11. Each polymer in FIG. 10 is designed to emphasize different properties and interactions. The methyl-substituted carbosiloxane polymer, dubbed CSME in the figure, is a nonpolar material that is good for sorbing aliphatic hydrocarbons. It is the same or similar to other carbosiloxane polymers prepared previously (see FIG. 9), and has sorbent properties similar to poly(dimethylsiloxane) and poly(isobutylene).

The phenyl-substituted polymer, CSPH, was prepared because phenyl groups provide greater polarizability than simple aliphatic groups. On sensors, these polymers offer sensitivity to aromatic hydrocarbons such as benzene, toluene, ethylbenzene, and xylenes (BTEX), as well as to chlorinated hydrocarbons. Both these classes of compounds are environmental contaminants of concern. Although other phenyl-substituted polymers with low glass-to-rubber transition temperature are available, such as the gas chromatographic stationary phase OV-25, we were motivated to prepare our own carbosiloxane polymer in order to have control over composition, properties, and formulation for sensing films. OV-25 is a polysiloxane with 75% phenyl substituents and 25% methyl substituents. Similarly, CSPH was designed to have a high ratio of phenyl-to-methyl groups (67%). Commercial OV-25, however, has been shown to have slight hydrogen-bond acidity that is probably attributable to residual Si—OH groups. This compromises the desired chemical selectivity. In our experience, commercial polymers often contain functionalities or contaminants that are not indicated by the nominal polymer structure, and sometimes these can be seen in the infra-red spectrum. In addition, we observed erratic behavior of OV-25-coated SAW devices under humid conditions that was empirically resolved by using our carbosiloxane polymer instead.

The polymer containing the urea group, UR3, was prepared in order to obtain a basic polymer for chemical sensor arrays. Urea groups are known to be very basic and dipolar. The hydrosilylation polymerization proceeded smoothly and this material has yielded well-behaved chemical sensors when applied to SAW devices. Other basic polymers such as polyvinylpyrrolidone and polyethyleneimine have basic properties and have been applied to SAW devices as sensor coatings. However, polyvinylpyrrolidone does not have the low glass-to-rubber transition temperature that is desirable, and poly(ethyleneimine) has yielded sensors with poor reproducibitility. Again, shortcomings of commercial materials for our application prompted us to synthesize our own low glass-to-rubber transition temperature basic polymer.

The Bisphenol-containing polymer, BSP3, is one of our most interesting and useful polymers. This polymer was rationally designed to have strongly-hydrogen bond acidic properties that are desirable for sorbing basic vapors. There exist a great many basic organic solvents that are used industrially that one might want to detect. In addition, some of the vapors of national security concern, such as nerve agents, are strong hydrogen bond bases. Recent work has shown that polymers in this class are also useful for detection of nitroaromatic explosives. Thus, the desirability of strongly hydrogen-bond acidic polymers for basic vapor detection is evident. In addition, these polymers are desirable in sensor arrays to enhance chemical diversity within the array.

A consideration of the chemical structures that lead to hydrogen bond acidity leads to a choice of fluorinated alcohols and phenols as the functionality that should be incorporated into a polymer. However, commercial polymers with these functionalities and low glass-to-rubber transition temperatures have not been available. Accordingly, a number of synthetic materials have been prepared and investigated as sensor phases, most of which incorporate hexafluoroisopropanol moieties as the hydrogen bond acidic group.

Figure 12:
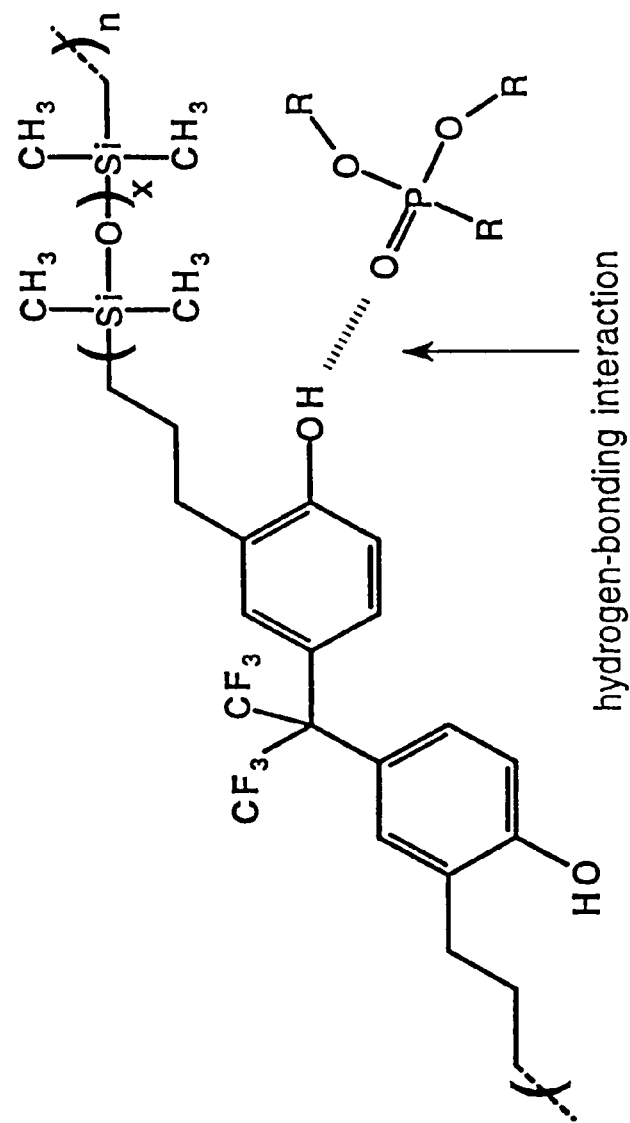
FIG. 12 shows interaction of a BSP polymer with a basic vapor.

A study several years ago compared the hydrogen bond acidities of several propyl- or allyl-substitued Bisphenol structures using inverse gas chromatography and LSERs. It was shown that fluorinated Bisphenol-A structures were substantially more hydrogen-bond acidic than non-fluorinated analogs; fluorination improved sorption of basic compounds by factors of 100 or more. These considerations provided the rational design criteria for synthesis of polymers containing the fluorinated Bisphenol structure in the polymer chain. The BSP3 polymer shown in FIG. 10 has 3 silicon atoms in the repeat unit. Variants have also been synthesized with longer oligosiloxane units. Interaction of a BSP polymer with a basic vapor is shown in FIG. 12.

Figure 13:
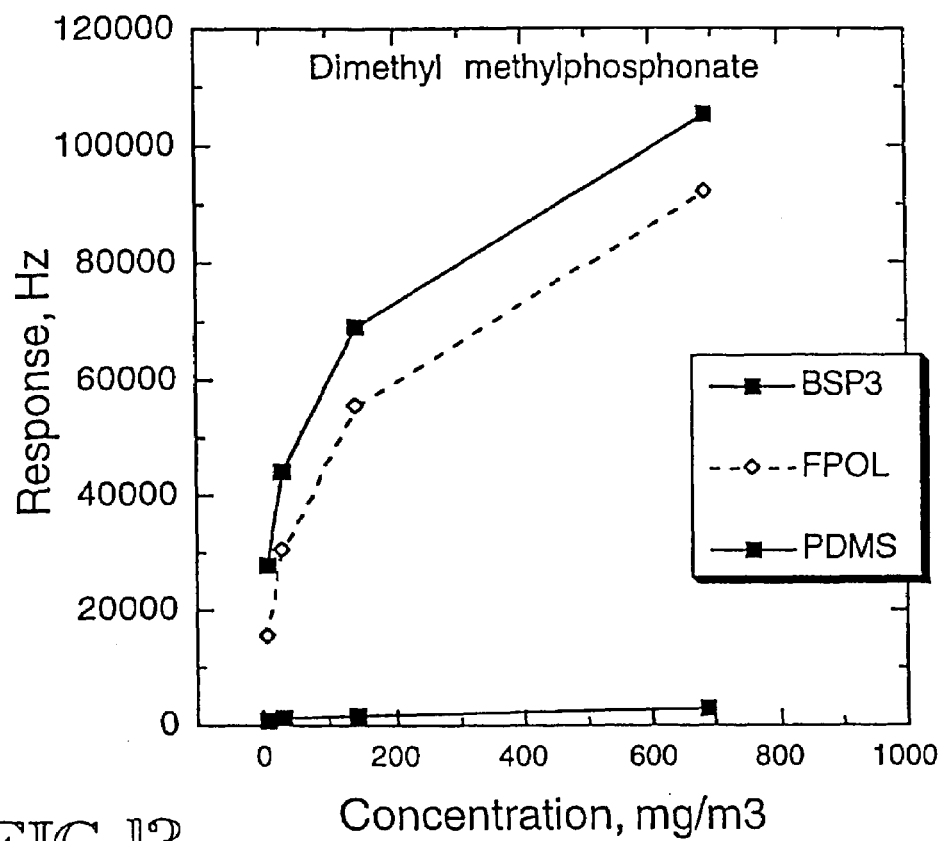
FIG. 13 shows calibration curves for SAW sensors coated with BSP3, Fluoropolyol (FPOL), and polydimethylsiloxane (PDMS) when tested against dimethyl methylphosphonate, a nerve agent stimulant.

Experiments on SAW sensors have shown that these phenolic polymers are useful in sensing basic vapors and nerve agent simulants, and have properties that are equal to or superior to previous materials in this category. FIG. 13 shows the calibration curves for SAW sensors coated with BSP3, fluoropolyol (FPOL), and polydimethylsiloxane (PDMS) when tested against dimethyl methylphosphonate, a nerve agent stimulant. FPOL is a sensor coating for nerve agents described in the past, and PDMS serves as an example of a sorbent polymer lacking functionalities designed for sorption of basic vapors. Signals of greater than 20,000 Hz are observed at a concentration of only 8 mg/m$^3$ using BSP3. This corresponds to a concentration of 1–2 ppm, indicating that detection limits for a minimum detectable signal of 10 Hz would be about 1 ppb.

Together, the polymers in FIG. 10 can provide the chemical diversity that is desirable in small sensor arrays. It is also worth noting the variety of monomers that can be applied in this synthetic approach, some of which are shown in FIG. 11. There exist many organic dienes that could be combined with α, ω-dihydroorganosiloxanes to yield carbosiloxane polymers. Any monomer on the left side of FIG. 11 could, in principle, be combined with any monomer on the right side. While this is not combinatorial chemistry per se, and so far we have prepared polymers in individual batches rather than in parallel, it does illustrate the principle that a variety of materials can be efficiently prepared by various combinations of a limited number of starting monomers.

Figure 14:
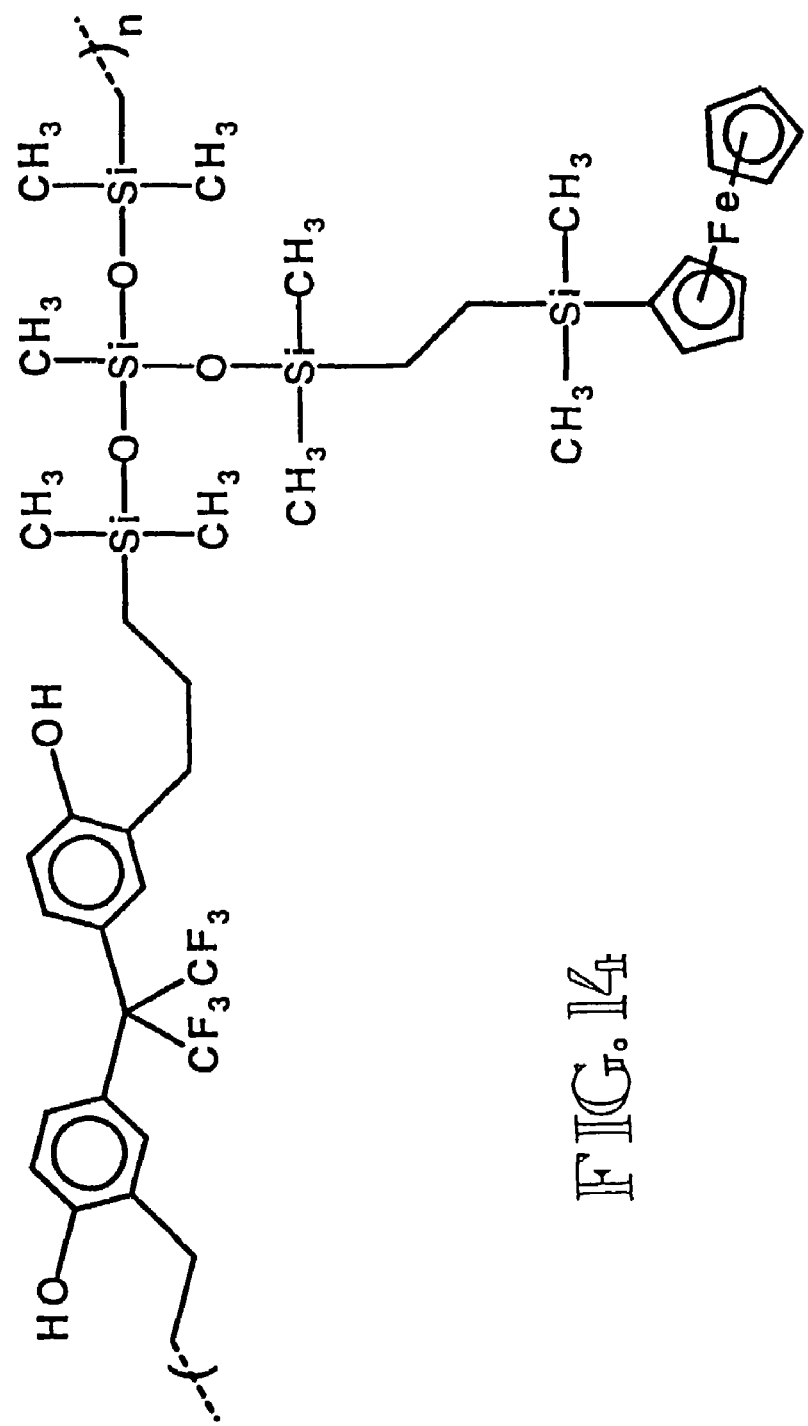
FIG. 14 shows a polymer produced by combining the ferrocene-derivatized monomer shown in FIG. 11 with a Bisphenol monomer also shown in FIG. 11.

We have prepared a ferrocene-derivatized monomer shown in FIG. 11 in which ferrocene is appended to an oligosiloxane chain that is terminated in Si—H groups. We successfully combined this monomer with the Bisphenol monomer also shown in FIG. 11, producing a polymer whose repeat unit is shown if FIG. 14. Cyclic voltammetry on both solutions and thin films of this resulting material confirmed the presence of redox-active ferrocene groups. The usefulness of electrofunctional polymers in the analytical sciences and especially in sensor development has been noted. In principle, one could prepare a whole series of functionalized redox-active polymers by combining the ferrocene containing monomer with various monomers on the left side of FIG. 11 or with other organic dienes.

It is also possible to vary the properties of these materials in order to meet other sensor requirements. We were interested in coating a hydrogen-bond acidic polymer as the cladding on silica optical fibers. This platform imposed the requirement that the refractive index of the polymer be lower than that of silica (approximately 1.46) in order to efficiently guide light. In addition, the material had to be formulated as a prepolymer that could be coated on a fiber pulled freshly from the melt using an automated optical fiber drawing tower. The prepolymer is then cured in a tube furnace before the clad fiber is wound onto the drum of the fiber drawing system. A viscosity in the range of 1000–3000 centipoise was desired to permit delivery of prepolymer to a cladding cup through ¼" or ⅜" tubing. BSP3 is unsuitable for direct use in this application because its refractive index is 1.48 and it is a gum phase.

We prepared a liquid prepolymer with a viscosity in the range of 1500 cSt. And a refractive index of 1.42 using a much longer α, ω-dihydroorganosiloxane as a macromer (ca. 80 dimethylsiloxy links) under conditions leading to a lower molecular weight product. Two equivalents of the fluorinated Bisphenol in FIG. 11 were reacted with one equivalent of this macromer, yielding an allyl-terminated Bisphenol containing prepolymer. This material was combined with a platinum catalyst and miscible crosslinker (phenyltris(dimethylsiloxy)silane) (see FIG. 15) containing three Si—H groups and applied to fibers as described above. Sections of fibers clad by this approach were as effective at guiding light as commercially available plastic fibers or silica fibers clad in our own laboratory with commercial polydimethylsilicone cladding formulations. This example illustrates the versatility of the approach for synthesizing polymers and oligomers containing a desired functionality while tuning the physical properties for a particular sensing platform.

The carbosiloxane polymers prepared by hydrosilylation polymerization are intrinsically terminated with groups that can be used for crosslinking. By design, these can be essentially all terminal silicon-hydride or all terminal vinyl or allyl groups. Addition of a platinum catalyst and a multifunctional crosslinker, such as those shown in FIG. 15, yields a formulation that will crosslink on curing. Use of hydrosilylation is one of a number of reactions that are conventionally use for crosslinking vinylmodified polysiloxanes. Crosslinking is required for some sensor formats, such as the optical fibers described above, and may be desirable for other sensor formats. A crosslinked film will have mechanical stability is less likely to fail by dewetting the surface. In addition, crosslinked films may offer enhanced sensor stability and lifetime. Rapp and coworkers investigated the UV-initiated free-radical crosslinking of polysiloxane films on SAW devices. It was found that crosslinking offered sensors with superior stability compared to uncrosslinked polysiloxanes. Hydrosilylation chemistry provides a clean reaction for crosslinking that can often be conveniently carried out in air.

Furthermore, polymer films can be grafted to surfaces at the same time by the same reaction chemistry. Modification of surfaces with silanes to give Si—H or vinyl terminated surfaces is well known. These surface groups can participate in the crosslinking reactions to covalently attach some of the polymer chains to the surface. Evidence that such grafting actually occurs is apparent when solvents are used in an effort to remove uncrosslinked films, crosslinked films, and crosslinked-grafted films. We have found cases where lightly crosslinked films are dissolved or detached from unmodified surfaces by suitable solvents, but the corresponding crosslinked and grafted films on modified surfaces remain adherent.

Our overall scheme for polymer synthesis, crosslinking, and grafting is shown in FIG. 16. Hydrosilylation polymerization generates polymers or oligomers incorporating interactive groups (indicated in the figure by squares with the letter I inside) for chemical selectivity. These may also have a redox-active center or reporter group incorporated in the structure, as indicated by "R" in the figure. By design, this approach yields chains with terminal vinyl (shown) or silicon hydride groups for crosslinking. Formulation with multifunctional crosslinkers (vinyl or Si—H substituted) and catalyst offer curable films. The same procedure on modified surfaces (vinyl or Si—H modified can yield crosslinked and grafted films. Thus, hydrosilylation is used in polymer synthesis, polymer crosslinking, and polymer grafting.

The fact that solubility varies depending on crosslinking and grafting suggests that hydrosilylation could also be used for photopatterning polymer films. This would simply require a catalyst that was inactive until exposed to light. Platinum(II) bis(β-diketonates) such as platinum(II) bis (acetylacetonate), or Pt(acac)$_2$, offer these properties. These compounds have been used as photoactivated hydrosilylation catalysts for solution reactions, polymerization of vinyldimethylsilane in solution, and for curing and patterning preceramic polymer films.

Figure 6:
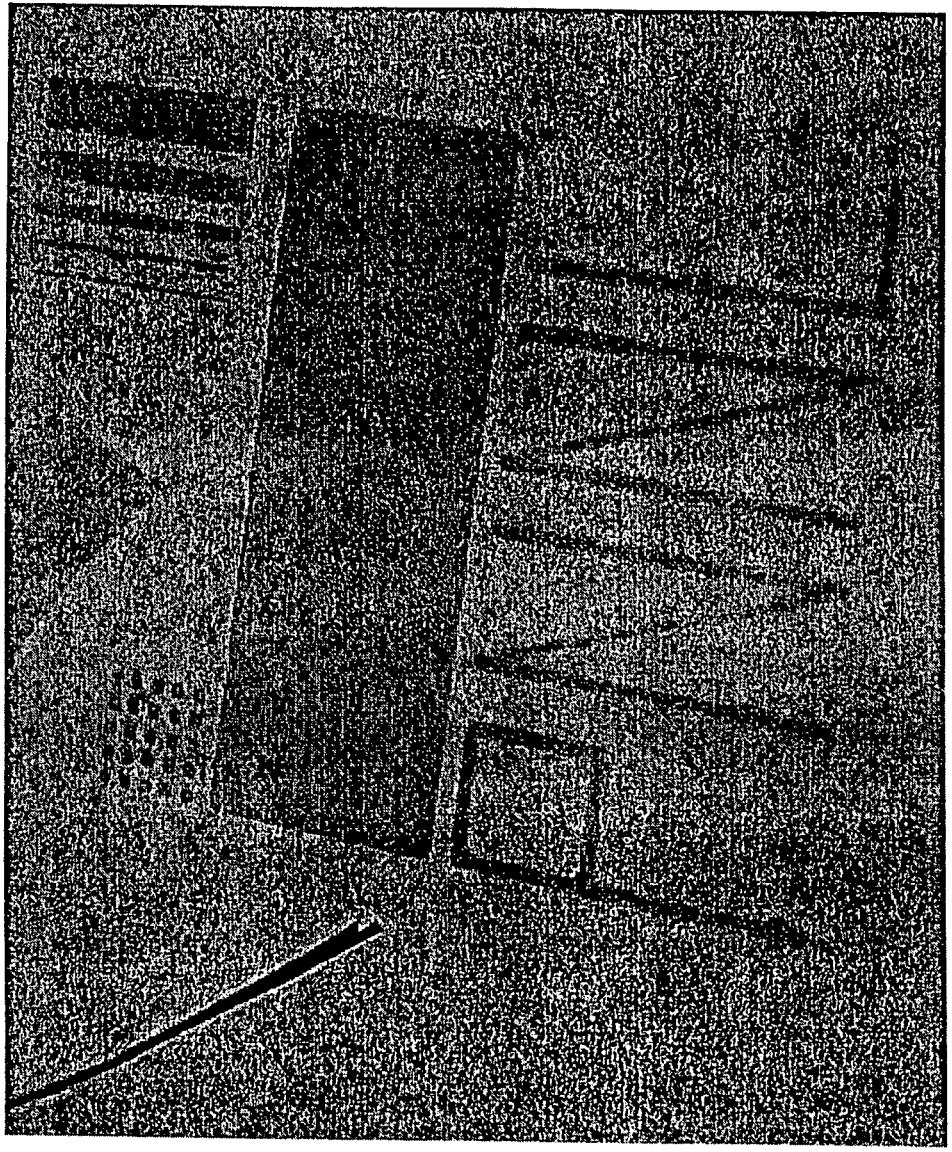
FIG. 6 is a photograph of a photopattern film showing a developed image next to a human hair.

We have found this chemistry to be useful for patterning sorbent and functionalized siloxane and carbosiloxane polymers. FIG. 6, for example, shows the results of patterning a polydimethylsiloxane formulation using Pt(acac)$_2$ as the photoactivated catalyst in the reaction of vinyl-terminated polydimethylsiloxane with a methylhydrodimethylsiloxane copolymer. Only those regions of a spin-cast film of these components that was exposed to light to activate the catalyst underwent hydrosilylation crosslinking. After exposure the pattern was developed by dissolving and removing unexposed material. We have photopatterned films from 50 mn to 5 micron in thickness by this method. The 5×5 array of squares in FIG. 10 has individual squares that are 100 micron by 100 micron in area. A human hair is included in the picture for reference.

Similarly, a variety of other functionalized sorbent materials can be photopatterned by these methods. Care must be taken to use crosslinkers that are miscible with the vinyl-functionalized polymer, and to allow an adequate dark reaction time before developing the pattern by dissolving away uncrosslinked materials. Simultaneous grafting to the surface is often necessary to retain the pattern. We have patterned phenyl- and cyano-substitued siloxane formulations in this way.

While the reactions above are based primarily on photo-activated hydrosilylation crosslinking, it is also possible to photoactivate polymerization as part of the patterning process. For example, we have formulated a prepolymer film containing Pt(acac)$_2$, the Bisphenol monomer shown in FIG. 11, and a silicon hydride terminated oligomer that was prepared and isolated from the reaction of the same monomer with excess of an α, ω-dihydrodimethylsiloxane. A small amount of crosslinker was also included in the prepolymer. Photoactivated polymerization and pattern development on a vinyl-modified silicon surface gave the lines shown in FIG. 5.

Alternatively, patterns of highly crosslinked network polymers can be obtained by formulating functionalized monomers or oligomers with multifunctional crosslinkers. However, excessive crosslinking can significantly raise the glass-to-rubber transition temperatures. Obtaining sufficient crosslinking to retain polymer patterns on the substrate after rinsing with the pattern development solvent, while maintaining a low glass-to-rubber transition temperature, requires a delicate balance of polymer formulation, crosslinker, dark reaction time, and solvent selection.

We have found that a variety of functionalities, including all those in FIG. 10 as well as cyano groups can be incorporated in photopatterned siloxane or carbosiloxane polymer films. Thus, the patterning approach has great potential for use in sensors and sensor arrays.

Acoustic wave sensors such as the quartz crystal microbalance (QCM) and surface acoustic wave (SAW) device are often the basis for polymer-coated sensor arrays. Flexural plate wave (FPW) devices can also be coated with polymers for chemical sensing. In this case, the active surface of the devices is at the bottom of an etch pit in a silicon chip. It is possible to fabricate several of these devices on a single chip, leading to an array-on-a-chip. Different polymers can then be applied to the active devices in their individual etch pits.

Figure 17:
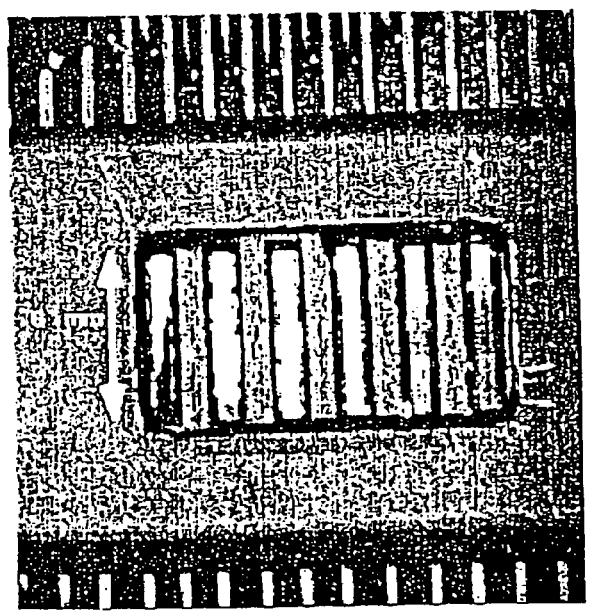
FIG. 17 is a photograph of a packaged FPW array on a chip.
Figure 18:
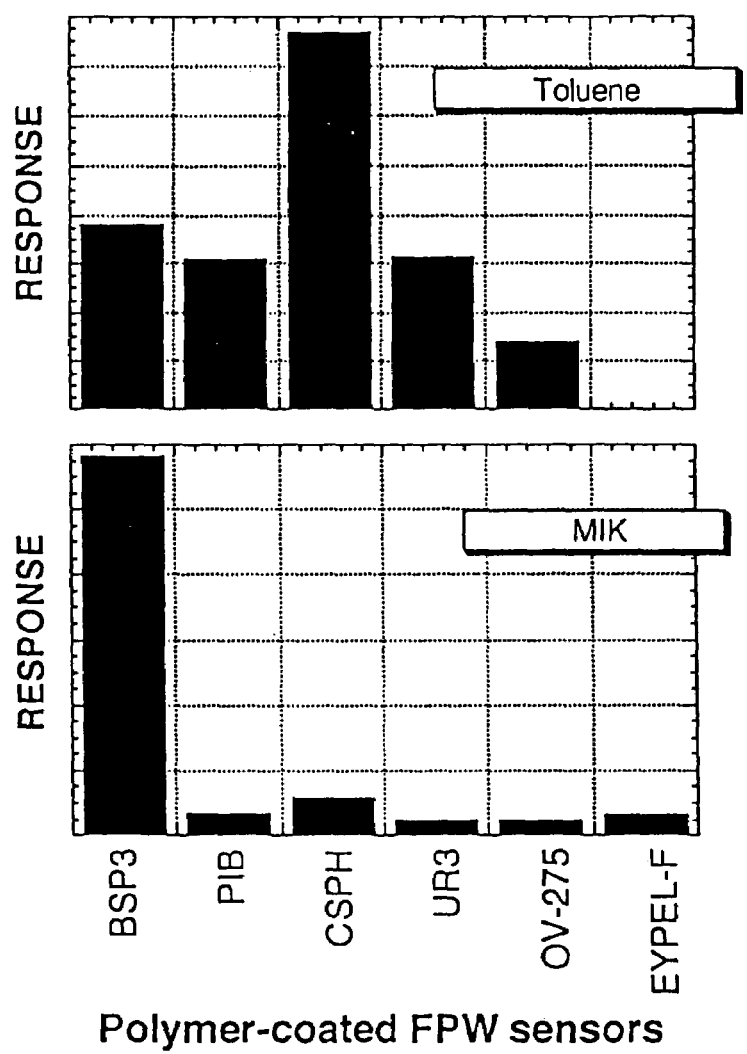
FIG. 18 is a graph of sensor responses to the vapors from two industrial solvents, toluene and methylisobutylketone.

A picture of a packaged FPW array-on-a-chip is shown in FIG. 17. Sensor responses to the vapors from two industrial solvents, toluene and methylisobutylketone, are shown in FIG. 18. The array was coated with three of the carbosiloxane polymers shown in FIG. 10. (BSP3, UR3, and CSPH) and three other commercial polymers (poly(isobutylene, OV-275, and Eypel-F). These two bar graphs illustrate the generation of distinguishable patterns for different vapors, as first suggested by FIG. 7. The patterns in FIG. 18 support some of the chemical selectivity principles that are the basis for our rational design approach. The most sensitive of these diverse polymers for toluene is the polarizable CSPH polymer. The most sensitive polymer for basic methylisobutylketone is BSP3.

Hydrosilylation chemistry offers tremendous versatility in the development of sorbent and functionalized polymers and thin films. Diverse sets of polymers can be prepared with control over chemical and physical properties of the resulting materials and formulations. The chemistry can be further utilized in the crosslinking, grafting, and patterning of thin films. These types of materials and films are useful or potentially useful for chemical sensors, sensor arrays, membranes, solid phase extraction, chromatography, and lab-on-a-chip applications.

Figure 1:
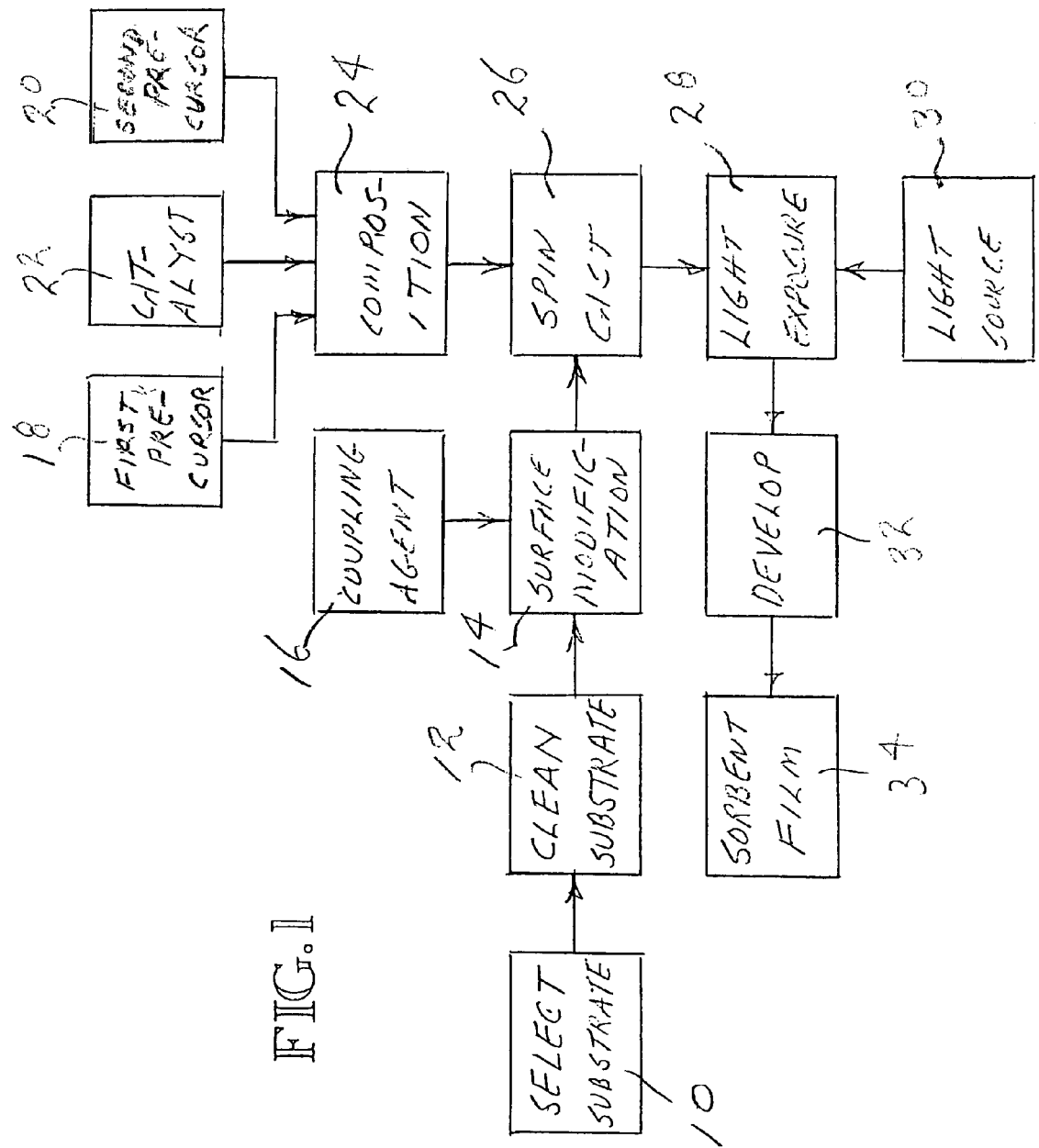
FIG. 1 is a flow diagram of method steps that characterize some aspects of the present invention.

Referring to FIG. 1, the method of the invention commences with the step 10 of selecting a substrate. The substrate could be anyone of a number of different devices or surfaces. It may serve only as a carrier for the film or it may be a functional device itself in addition to supporting the film. Following its selection, the substrate is cleaned at station 12. The preferred way of cleaning is by use of a plasma cleaner, as disclosed below. In most cases, the next step 14 is to modify the surface of the substrate by coating it with a coupling agent from a source 16. The coupling agent may also be termed a grafting agent. A suitable polymer 18, a crosslinking material 20 and a catalyst 22 are combined to form a composition 24 that is applied to the coupling agent as a film or coating, for example, by a spin cast technique at station 26. The substrate is placed on to a turn table that is rotated at a high speed while the composition 24 is applied onto the prepared surface of the substrate. Next, the film or coating on the substrate is exposed to a light that will trigger hydrosilylation reactions in those regions that are contacted by the light. Following exposure to light at station 28, from a light source 20, the exposed film or coating is developed. Specifically, it is subjected to a solvent that will remove the non-exposed portions of the composition coating while leaving the exposed portions as a film of sorbent material that remain on the surface. In some embodiments, the sorbent film is grafted to the substrate. Sorbent films formed by the invention may have distinct functions, e.g. they may function as chemical sensors.

In the examples that follow, promising materials were applied to silicon wafers and processed to leave on the wafer a sorbent film designed to be selective for some chemical species relative to other chemical species when exposed to such species.

The silicon wafers were first plasma cleaned by use of a PDC-3XG Plasma Cleaner obtained from the Harrick Scientific Corp. of Ossining, N.Y. 10562. The materials were then applied to the wafer surface to form a surface coating. At times it was necessary to pre-treat the wafer surface with a coupling agent before applying the materials.

To pre-treat, the substrates (wafers) were placed within a 250 mL reaction kettle (Teflon® gasket), equipped with a condenser and nitrogen source. To the kettle was added 0.3 g of coupling agent in 70 mL of HPLC-grade acetone. The cilane coupling agents examined were triethoxysilane and triethoxyvinylsilane. The solution was stirred at approximately 50° C. for forty-eight hours.

The substrate (wafer) was removed from the cooled solution, washed with clean acetone, dried under a nitrogen stream, and then stored in a drying chamber until used.

The coated surfaces were then exposed to patterns of ultraviolet light. In most examples, the coated substrates (wafers) were exposed to ultraviolet light in a HTG 3A mask aligner. Designed for large area proximity printing, the HTG unit expands the life from a high pressure, mercury lamp; the final beam intensity, between 300–400 mm is about 10 mW/cm$^2$. The light is a uniform and columnated 20 cm diameter beam which is patterned through a photo mask before striking the colded wafer.

The photo mask is an iron oxide coating glass plate made selectively transparent to the ultraviolet light by etching away regions of the iron mask. For these experiments, the opening in the iron mask was 28 micro wide line.

Exposure can also be done by use of a Research Devices micro pattern generator. It uses an Oriel 500 watt high pressure mercury lamp to illuminate photosensitive material through a Nikon microscope. This light source has strong irradiance between 300 and 450 nm. The beam is columinated, then shaped by focusing through a variable rectangular aperture and sized by focusing through the microscope objective. Rectangular spots between 5 and 500 microns in either dimension are possible. The ultraviolet light power at the sample is about 4000 m W/cm and 2. Patterns are created by opening and closing a high speed shutter as the precision stage is translated around a CAD drawing. The aperture shape also changes as needed to pattern the various features. Then, the surfaces are treated with a solvent to remove the unexposed portion of the surface coating, leaving on the wafer a film pattern of sorbent material that will absorb a predetermined chemical species when exposed to such species.

EXAMPLE 1

Methyl

The following example illustrates the photopatterning of a non-polar sorbent material consisting of polydimethylsiloxane. Two polymers are mixed with a catalyst. One polymer (DMS-V31) consists of polydimethylsiloxane with terminal vinyl groups. The other polymer (HMS-301) has silicon hydride groups distributed along the chain. Thus, in this example, both the vinyl containing and the SiH containing crosslinkers are polymeric. More specifically, this example involved use of the following materials:

| | |
|---|---|
| DMS-V31: (polymer) | vinyl-terminated dimethylsiloxy, MW 28,000, obtained from Gelest, Inc. of Tullytown, PA. 19007-8308 U.S.A. |
| HMS-301: (crosslinker) | hydromethyldimethylsiloxane, MW 2000 and 25% MeSi—H, obtained from Gelest, Inc. of Tullytown, PA. 19007-8308 U.S.A. |
| Catalyst: | Pt (acac)$_2$; obtained from Aldrich Chemical Co., Inc. of Milwaukee, WI. 53201-0335 U.S.A. |
| Catalyst Solvent: | dichloromethane solution. |
| Wash Solvent: | xylene |

A silicon wafer was plasma cleaned and a film was applied to a surface of the wafer by spin coating at three-thousand revolutions per minute (3000 rpm), using the following composition amounts:

0.057 g (2.3×10$^{-5}$ mole) DMS-V31
0.020 G (1.01×10$^{-5}$ mole) HMS-301
2 drops of 0.05 M Pt(acac)$_2$ in dichloromethane
0.5 mL dichloromethane as solvent The film or coating on the wafer was exposed to light using the mask aligner system. Immediately following exposure, the surface was washed with xylene to develop the pattern. Individual lines were exposed for 60 seconds, 120 seconds, 140 seconds, 180 seconds and 300 seconds. The solvent removed the unexposed material leaving a pattern of lines corresponding to the 120 second, 140 second, 180 second and 300 second exposures. The line exposed for only 60 seconds did not remain after developing the pattern with the xylene solvent wash. This example was repeated using a coupling agent (triethoxyvinylsilane) on the silicon wafer prior to applying the film or coating. No improvement was noted when the coupling agent was used.

The pattern produced by this example is not illustrated. However, it could look like the pattern shown by FIGS. 2 and 3 but showing only four lines.

EXAMPLE 2

Phenyl

The following example illustrates the photopatterning of a polysiloxane that contains phenylsubstituents. These increase the polarizability of a sensing polymer relative to polydimethylsiloxanes. The polymer in this example is 50% phenyl substituted and it contains 1% vinyl substituents randomly distributed along the chain. The crosslinker is a simple tetrafunctional crosslinker, meaning it has four silicon hydride groups. Thus, this example crosslinks a polymer with randomly distributed vinyl groups with the simple molecular silicon-hydride containing crosslinker. More specifically, this example involved use of the following materials:

| | |
|---|---|
| OV-17: (polymer) | phenyl - Substituted Polysiloxane-(50% phenyl, 1% random vinyl), MW 4000), obtained from Ohio Valley Specialty Chemical of Marietta, OH 45750-9355, U.S.A. |
| Si—H: (crosslinker) | 1,3-diphenyl-1,1,3,3-tetrakis(dimethylsiloxy) disiloxane, MW 527, obtained from Gelest, Inc. of Tullytown, PA 19007-6308 U.S.A. |
| Catalyst: | Pt(acac)$_2$, obtained from Adrich Chemical Co., Inc. of Milwaukee, UI 53201-0335 U.S.A. |
| Catalyst Solvent: | dichloromethane solution |
| Coupling Agent I: | triethoxysilane |
| Coupling Agent II: | triethoxyvinylsilane |
| Wash Solvent: | dichloromethane: Hexane 1:1 (lil v/v), Obtained from |

A silicon wafer was plasma cleaned as described above. Then the cleaned surface was pretreated with triethoxyvinylsilane to place on the surface bound vinyl groups for grafting of the polymer (OV-17) to the surface. A film or coating was applied to the pretreated surface by spin coating three thousand revolutions per minute (3000 rpm), using the following composition amounts:

0.32 g ($8.1 \times 10^{-5}$ mole) OV-17 (equates to $8.1 \times 10^{-7}$ mole of vinyl)

0.00085 g ($1.6 \times 10^{-6}$ mole) diphenyltetrakis (dimethylsiloxy)disiloxane 2 drops of 0.05 M Pt(acac)$_2$ in dichloromethane 0.5 mL dichloromethane as solvent The surface coating on the wafer was exposed to ultraviolet light using the mask aligner system. Individual lines were exposed for 40 seconds, 80 seconds, 100 seconds, 120 seconds and 160 seconds. The exposed film was then placed into the dark for eighteen hours after which the pattern was developed using the dichloromethane: Hexane 1:1 wash solution. The solvent removed the unexposed material leaving a pattern of lines corresponding to the exposure times.

The example 2 procedure was repeated both without wafer pretreatment and with wafer pretreatment by use of triethoxysilane. No lines were retained when there was no pretreatment. Lines were retained when either of the coupling agents were used. The triethoxyvinylsilane resulted in there being more distinct edges to the pattern and so this coupling agent is preferred.

Figure 2:
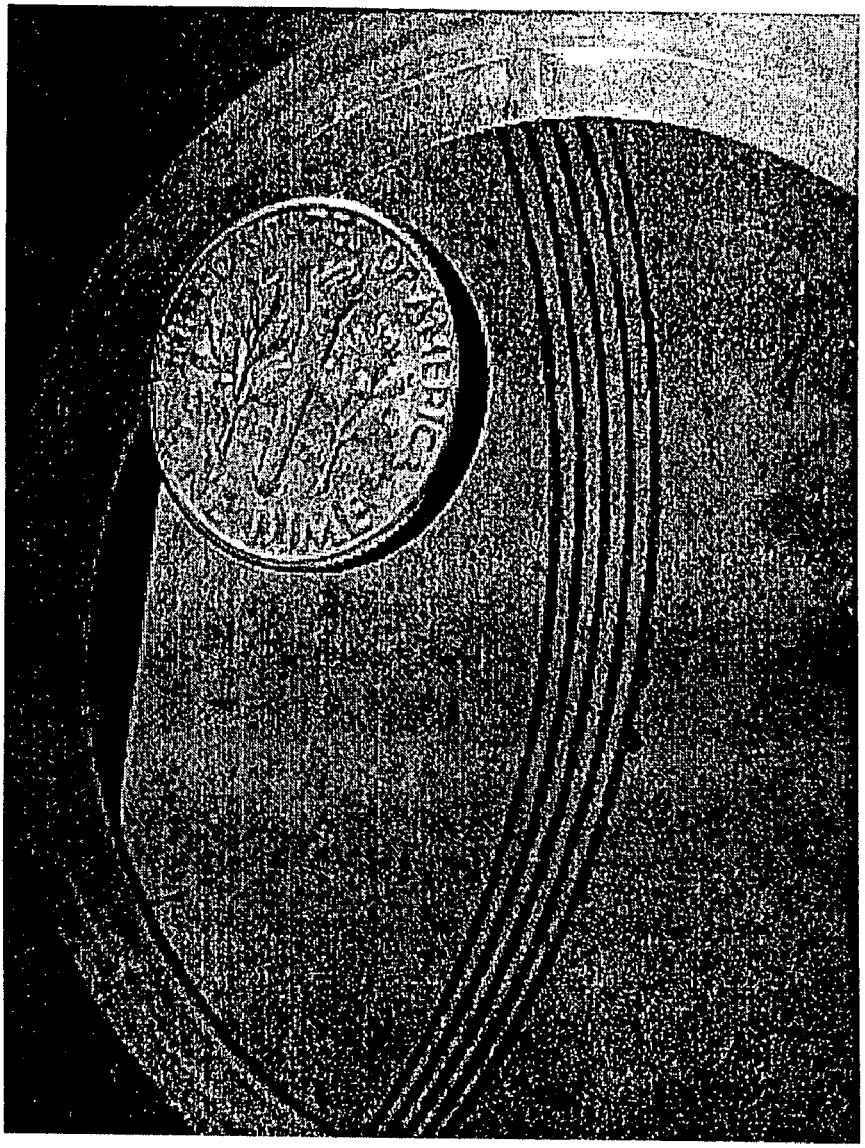
FIGS. 2 and 3 are photographs showing the photopatterning of a polysiloxane that contains phenyl substituents.
Figure 3:
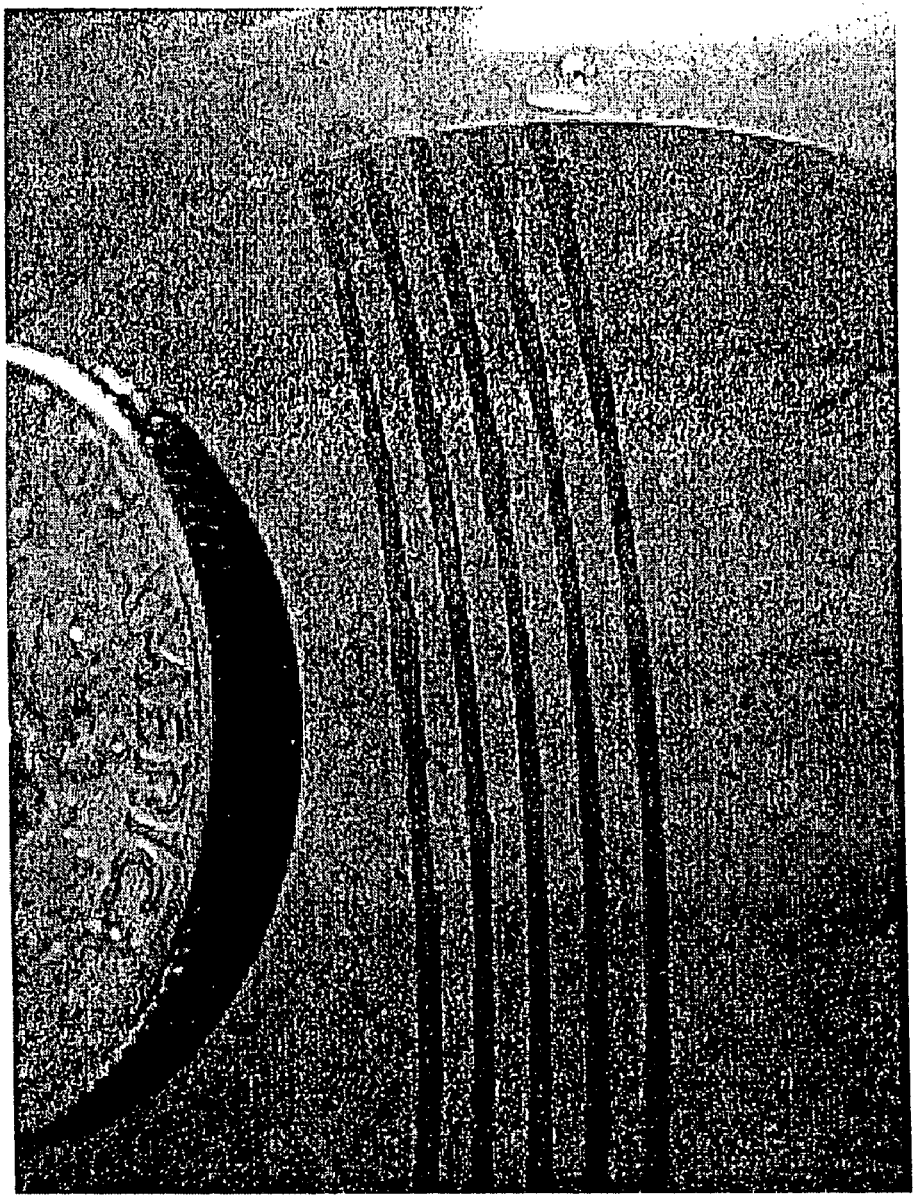

The pattern produced by example 2 is shown by FIGS. 2 and 3.

EXAMPLE 3

Cyano

The following example illustrates the photopatterning of a polysiloxane that contains cyano substituents. These increase the dipolarity and basicity of a sensing polymer relative to polydimethylsiloxane. The polymer in this example is 50% cyanopropylmethyl substituted and 50% phenylmethly substituted, and it contains 1% vinyl substituents randomly distributed along the chain. The crosslinker is a simple tetrafunctional crosslinker, meaning it has four silicon hydride groups. Thus, this example combines a polymer containing very polar functionalities and randomly distributed vinyl groups with a simple molecular silicon-hydride containing crosslinker. More specifically, this example involved use of the following materials:

| | |
|---|---|
| OV-225: (polymer) | Cyano - substituted polysiloxane: OV225 (cyanopropymethylphenylsiloxane, 1% random vinyl, MW 8000), obtained from Ohio Valley Specialty Chemical of Marietta, OH 45750-9355 |
| Si—H: (crosslinker) | 1,3-diphenyl-1,1,3,3-tetrakis (dimethylsiloxy) disiloxane, MW 527, obtained from Gelest, Inc. of Tullytown, PA 19007-6308 U.S.A.. |
| Catalyst: | Pt(acac)$_2$, obtained from Adrich Chemical Co., Inc. of Milwaukee, WI 53201-0335 U.S.A. |
| Catalyst Solvent: | dichloromethane solution |
| Coupling Agent I: | triethoxysilane |
| Coupling Agent II: | triethoxyvinylsilane |
| Wash Solvent: | dichloromethane: Hexane (lil v/v), obtained from |

A silicon wafer was plasma cleaned in the manner described above and the surface was pretreated with triethoxyvinylsilane to leave surface bonded vinyl groups for grafting the polymer to the surface. A coating was applied on to the pretreated surface by spin coating at three thousand revolutions per minute (3000 rpm), using the following solution composition:

0.47 g ($5.9 \times 10^{-5}$ mole) OV-225

0.00031 g ($5.9 \times 10^{-7}$ mole) diphenyltetrakis(dimethylsiloxy) disiloxane 2 drops of 0.05 M Pt(acac)$_2$ in dichloromethane 0.5 mL dichloromethane as solvent The above procedure was repeated twice, once without pretreatment and once using triethoxysilane as the coupling agent, to leave surface bound Si—H groups for grafting. With both coupling agents, the wafer was exposed to ultraviolet light using the mask aligner system. Individual lines were exposed and the wafer was left in the dark eighteen hours before developing the pattern, using dichloromethane: Hexane 1:1, as the developing solvent. In both cases, the solvent removed the unexposed material leaving a pattern of lines corresponding to the exposed lines. The surface pretreatment had a significant effect on the outcome. No lines were retained when the surface was not pretreated with either triethoxysilane or triethoxyvinylsilane. Thus, if the surface is not pretreated with a grafting agent, the polymer will not graft to the surface and the lines are not retained. Lines were retained when either triethoxysilane or triethoxyvinylsilane was used.

Figure 4:
FIG. 4 is a photograph showing the photopatterning of a polysiloxane that contains cyano substituents.

The pattern produced by this example is shown by FIG. 4. All three lines were retained, however, some edge loss was suffered.

EXAMPLE 4

BSP

The following example illustrates the creation of a photopattern film of a Bisphenol-containing polycarbosilixane polymer. Bisphenol groups make the polymer hydrogen bond acidic, which enhances interactions with basic analytes. Photoinitiation was used to polyerize, crosslink and graft the polymer. The initial composition consisted of monomer with two allyl groups, and olygomer terminated in silicon hydride groups, a molecular crosslinker and photoactivatable catalyst. The olygomer synthesized. More specifically, this example involved use of the following materials:

| | |
|---|---|
| BSP: (monomer) | Bisphenol-A containing monomer with Ally (groups: 2,2-bis) (3-allyl 4-hydroxyphenyl) hexafluoropropane, MW 416.4, obtained from Organic Consultants, Inc. of Eugene, OR. |
| DN96: | 2,2-bis (3-allyl-4-phdroxyphenyl) hexafluoro-Propane terminated with hexamethyltrisiloxane, MW 833 (DN-96) (see Example 5) |
| MW 527: | 1,3-diphenyl-1,1,3,3-tetrakis (dimethylsiloxy) disiloxane, MW 527, obtained from Gelest, Inc. of Tullytown, PA 19007-8308 U.S.A. |
| Catalyst: | $Pt(acac)_2$, obtained from Aldrich Chemical Co., Inc. of Milwaukee, WI. 53201-0335 U.S.A. |
| Coupling Agent: | triethoxyvinylsilane, obtained from |

Figure 5:
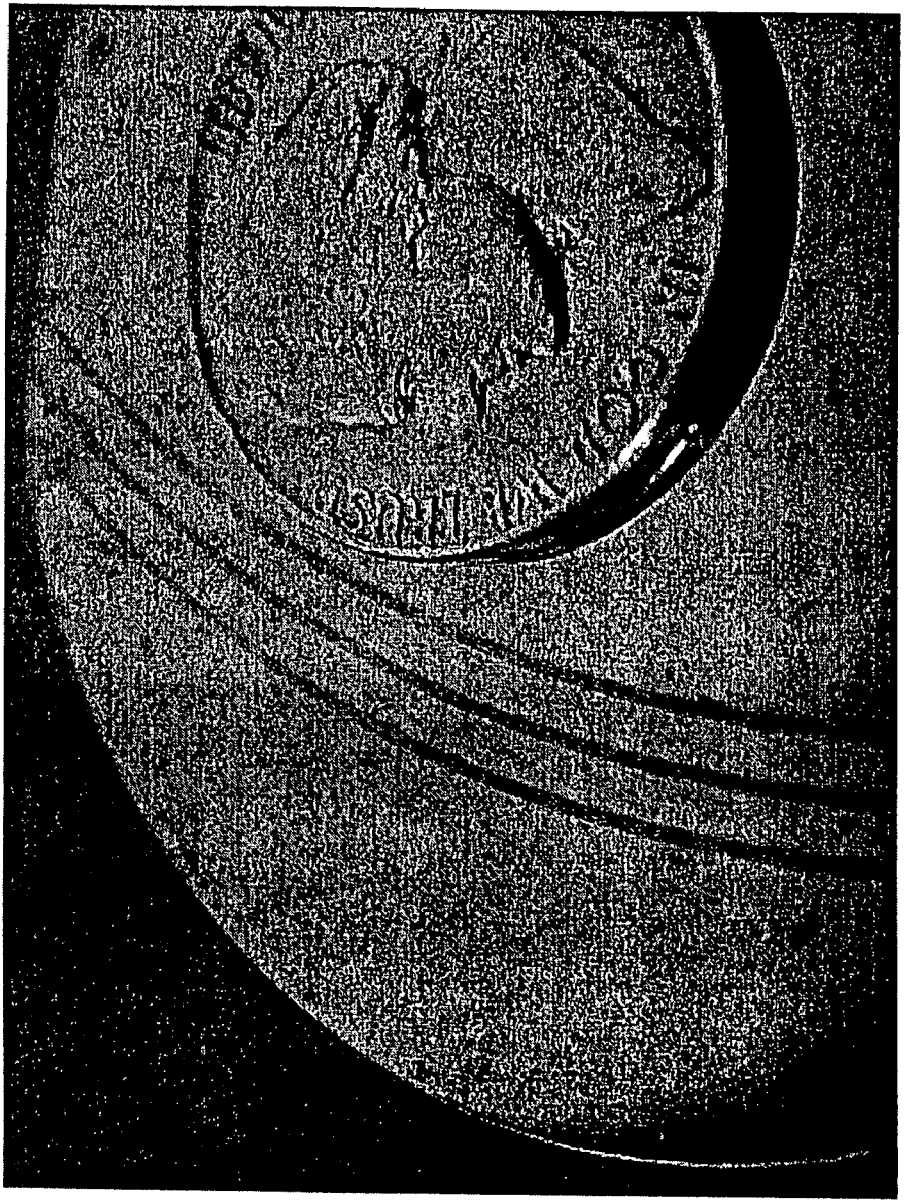
FIG. 5 is a photograph showing a photopattern film of a Bisphenol-containing polycarbosilxane polymer.

A silicon wafer was plasma cleaned in the manner previously described and the cleaned surface was pretreated with triethoxyvinylsilane to leave surface bound vinyl groups for grafting of the polymer to the surface. A coating was applied to the pretreated surface by spin coating at three thousand revolutions per minute (300 rpm), using the composition amounts set forth below:

- 0.082 g ($2.0\times10^{-4}$ mole) 2,2-bis(3-allyl-4-hydroxyphenyl)hexafluoroprane
- 0.33 g ($3.9\times10^{-4}$ mole) DN-96
- 0.002 g ($3.9\times10^{-6}$ mole) diphenyltetrakis(dimethylsiloxy)disiloxane
- 2 drops of 0.05 M $Pt(acac)_2$ in dichloromethane
- 2.0 mL dichloromethane as solvent The example was repeated twice, once without pretreatment and once with pretreatment by use of triethoxysilane. In each case, the coating was exposed to ultraviolet light using the mask aligner system. Individual lines were exposed for two and one half and ten minutes. The wafer was then placed in the dark for eighteen hours. At the end of the eighteen hours the coating was developed using dichloromethane: Hexane 1:1 as the developing solvent. This solvent removed the unexposed material leaving a pattern of lines composed of the exposed material. The surface treatment had a significant effect on the outcome. Lines were retained both when triethoxysilane was used and when triethoxyvinylsilane was used. No lines were retained when the surface was not pretreated with either triethoxysilane or triethoxyvinylsilane. Thus, if the surface is not treated so that the polymer will graft to the surface, then the lines are not retained. The pattern produced by this example is shown by FIG. 5. All three lines were retained.

EXAMPLE 5

Triad Containing Bisphenol-Monomer and Siloxane (DN96)

The Bisphenol-A monomer terminated with hexamethyltrisiloxane groups (Triad) was prepared in the following manner: 2,2-bis(3-allyl-4-hydroxyphenyl)hexafluoropropane (2.85 g, 0.0068 mol) was added to a magnetically stirred solution of 1,1,3,3,5,5-hexamethyltrisiloxane (14.3 g, 0.068 mole) in 100 mL of toluene. To this solution was added two drops of platinum-1,3-divinyltetramethyldisiloxane in xylene. The solution was heated to 100° C. for 18 h. The solution was cooled, stirred with activated carbon for 24 h, and filtered with vacuum and syringe filter techniques. The solvent and excess hexamethyldisiloxane were removed by distillation. Vacuum distillation was unsuccessful due to gellation of the product above 150° C. The yield of straw-colored oil (Triad) accounted for 5.4 g or 95%, based upon a presumed 3-unit product of $M_w$, 833. Preparative HPLC was used in an attempt to isolate the major products; the composition contained within this major fraction was $t'_R$ (area %): 3.5 (3.6%), 4.3 (8.3%), 4.8 (2.5%), 8.7 (2.8%), 9.7 (51.1%), 10.2 (21.9%), 12.0 (4.2%). $^{13}$C NMR ($CDCl_3$) 154.1, 133.2, 132.6, 129.6, 128.4, 128.3, 128.1, 125.8, 125.7, 114.9, 114.8, 125.1 (q), 63.9 (m), 33.7, 33.5, 23.8, 23.2, 18.2, 18.0, 1.4, 1.2, 0.4, −0.1. FTIR indicated a strong absorbance at 2127 $cm^{-1}$ which is indicative of Si—H.

EXAMPLE 6

A composition similar to that in example 1 was photo-patterned using the Research Devices micropattern generator, producing the results shown in FIG. 6. This illustrates more complex patterns of multiple lines, squares and rectangles next to a human hair for scale.

The illustrated embodiments are only examples of the present invention and, therefore, are non-limitive. It is to be understood that many changes in the particular structure, materials and features of the invention may be made without departing from the spirit and scope of the invention. Therefore, it is my intention that my patent rights not be limited by the particular embodiments illustrated and described herein, but rather determined by the following claims, interpreted according to accepted doctrines of claim interpretation, including use of the doctrine of equivalents and reversal of parts.

What is claimed is:

1. A method comprising:
    forming an analytical device by:
        placing on a substrate a composition containing a first precursor molecule containing at least two silicon hydride groups, a second precursor molecule containing at least two carbon—carbon multiple bonds, and a photoactivatable catalyst; and
        exposing a portion of said composition to light while leaving a different portion of said composition unexposed to the light, wherein the light is of a type and in an amount sufficient to cause hydrosilylation reactions to occur in the composition to provide a chemically selective sorbent film on the substrate.
2. The method of claim 1 where the catalyst is selected from the group consisting of platinum(II) bis(beta-diketonates).
3. The method of claim 1 wherein the second precursor molecule is selected from the group consisting of monomers, oligomers, polymers, and crosslinkers.
4. The method of claim 3 where the second precursor molecule is a polymer with vinyl groups pendant to the polymer chain.
5. The method of claim 4 where the polymer is a polysiloxane with vinyl groups pendant to the polymer chain.
6. The method of claim 5 where the polymer is a polysiloxane selected from the group consisting of OV225, OV17, OV275, and polydimethylsiloxane with vinyl substituents.
7. The method of claim 3 where the second precursor molecule is a polymer with a carbon—carbon multiple bond on each terminus.
8. The method of claim 7 where the polymer is a polysiloxane with vinyl groups on each terminus.
9. The method of claim 7 where the polymer is polydimethylsiloxane with vinyl groups on each terminus.
10. The method of claim 3 where the second precursor molecule is a monomer.
11. The method of claim 10 where the second precursor molecule is selected from the group consisting of molecules with two vinylsiloxy groups, molecules with two vinylsilane groups, molecules with two vinyldimethylsiloxy groups, and molecules with two vinylmethylphenylsiloxy groups.

12. The method of claim 10 where the second precursor molecule is an organic molecule with two allyl groups.

13. The method of claim 12 where the second precursor molecule is 2,2-bis(3-allyl-4-hydroxyphenyl)hexafluoropropane).

14. The method of claim 3 where the second precursor molecule is a crosslinker containing more than two carbon—carbon multiple bonds.

15. The method of claim 14 where the crosslinker is selected from the group consisting of molecules with more than two vinylsiloxy groups, molecules with more than two vinylsilane groups, molecules with more than two vinyldimethylsiloxy groups, and molecules with more than two vinylmethylphenylsiloxy groups.

16. The method of claim 1 where the second precursor molecule is a poly(carbosiloxane) with a carbon—carbon multiple bond on each terminus.

17. The method of claim 16 where the carbosiloxane polymer is selected from the group consisting of BSP3, UR3, CSPH, and CSME, where each was prepared to have carbon—carbon multiple bonds on each terminus.

18. The method of claim 1 wherein the first precursor molecule is selected from the group consisting of monomers, oligomers, polymers, and crosslinkers.

19. The method of claim 18 where the first precursor molecule is a polymer.

20. The method of claim 19 where the first precursor molecule is a polymer with silicon hydride groups along the polymer chain.

21. The method of claim 20 where the polymer is a polysiloxane with silicon hydride groups along the polymer chain.

22. The method of claim 21 where the polymer is a polysiloxane selected from the group consisting of poly(hydromethyl)(dimethyl)siloxane copolymers and poly(hydromethyl)siloxane.

23. The method of claim 19 where the first precursor molecule is a polymer with a silicon hydride group on each terminus.

24. The method of claim 23 where the polymer is a polysiloxane with a silicon hydride group on each terminus.

25. The method of claim 24 where the polymer is polydimethylsiloxane with a silicon hydride group on each terminus.

26. The method of claim 19 where the polymer is a poly(carbosiloxane) with a silicon hydride group on each terminus.

27. The method of claim 26 where the polymer is selected from the group consisting of BSP3, UR3, CSPH, and CSME, where each was prepared to have a silicon hydride group on each terminus.

28. The method of claim 18 where the first precursor molecule is an oligomer.

29. The method of claim 28 where the first precursor molecule is an oligomer with a silicon hydride group on each terminus.

30. The method of claim 18 where the first precursor molecule is a monomer with two Si—H bonds.

31. The method of claim 30 where the monomer is diphenylsilane.

32. The method of claim 18 where the first precursor molecule is a crosslinker with more than two Si—H bonds.

33. The method of claim 32 where the first precursor molecule is selected from the group consisting of 1,3-diphenyl-1,1,3,3-tetrakis(dimethylsiloxy)disiloxane, phenyl-tris(dimethylsiloxy)silane, and methyl-tris(dimethylsiloxy)silane.

34. The method of claim 1 where the hydrosilylation reactions cause polymerization to occur.

35. The method of claim 1 where the hydrosilylation reactions cause crosslinking to occur.

36. The method of claim 1 where the hydrosilylation reactions cause polymerization and crosslinking to occur.

37. The method of claim 1 where the composition contains effective amounts of hydromethyldimethylsiloxane (25% hydromethyl groups), vinyl-terminated polydimethylsiloxane, and Pt(II) bis(acetylacetonate).

38. The method of claim 1 wherein the analytical device generates a signal in response to the presence of an analyte.

39. The method of claim 1 wherein the chemically selective sorbent film has a glass-to-rubber transition temperature below the operating temperature of the chemically selective sorbent film.

40. The method of claim 1, further comprising, before said placing:
    modifying the surface to include a plurality of reactive groups effective to participate in the hydrosilylation reaction, wherein the reactive groups participate in the reaction by reacting with a member selected from the group consisting of the first precursor molecule, the second precursor molecule, and each of the first and second precursor molecules.

41. The method of claim 40 wherein said modifying comprises reacting a coupling agent with the surface of said substrate, said coupling agent including a reactive group selected from the group consisting of a silicon hydride group, a carbon—carbon multiple bond, and each of a silicon hydride group and a carbon—carbon multiple bond.

42. The method of claim 1 wherein the analytical device is a microanalytical device.

43. The method of claim 1 wherein the analytical device is selected from the group consisting of a chemical sensor, a separation membrane, a solid phase extraction device and a chromatograph.

44. The method of claim 1, further comprising leaving the chemically selective sorbent film in place on the substrate for subsequent use to selectively absorb a first chemical species to which the film is exposed.

45. The method of claim 1, wherein at least one of the first and second precursor molecules is selected based upon its having a chemically interactive property that is retained after the hydrosilylation reactions, and that provides to the chemically selective sorbent film a functionality whereby the film selectively absorbs the first chemical species more than a second chemical species.

46. A method comprising:
    forming an analytical device by:
       providing a substrate;
       cleaning the substrate;
       reacting a coupling agent with the surface of said substrate that appends to the surface reactive groups that can participate in hydrosilylation reactions;
       placing on a substrate a composition containing a first precursor molecule containing at least two silicon hydride groups, a second precursor molecule containing at least two carbon—carbon multiple bonds, and a photoactivatable catalyst; and
       exposing a portion of said composition to light while leaving a different portion of said composition unexposed to the light wherein the light is a type and in an amount of sufficient to cause hydrosilylation reactions to occur in the composition to provide a chemically selective sorbent film on the substrate.

47. The method of claim 46 wherein the coupling agent is selected from the group that appends silicon hydride or carbon—carbon multiple bonds to the surface.

48. The method of claim 47 wherein the coupling agent is selected from the group consisting of trialkoxysilane, trimethoxysilane, triethoxysilane, trichlorosilane, trialkoxyvinylsilane, trimethoxyvinylsilane, triethoxyvinylsilane, and trichlorovinylsilane, alkoxydimethylsilanes, chlorodimethylsilanes, alkoxydimethylvinylsilanes, and chlorodimethylvinylsilanes.

49. The method of claim 46 wherein the analytical device generates a signal in response to the presence of an analyte.

50. The method of claim 46 wherein the analytical device is a microanalytical device.

51. The method of claim 46 wherein the analytical device is selected from the group consisting of a chemical sensor, a separation membrane, a solid phase extraction device and a chromatograph.

52. The method of claim 46, further comprising leaving the chemically selective sorbent film in place on the substrate for subsequent use to selectively absorb a first chemical species to which the film is exposed.

53. The method of claim 46, wherein at least one of the first and second precursor molecules is selected based upon its having a chemically interactive property that is retained after the hydrosilylation reactions, and that provides to the chemically selective sorbent film a functionality whereby the film selectively absorbs the first chemical species more than a second chemical species.

54. A method of forming a chemically selective sorbent film, comprising:
  placing on a substrate a composition containing a first precursor molecule containing at least two silicon hydride groups, a second precursor molecule containing at least two carbon—carbon multiple bonds, and a photoactivatable catalyst;
  exposing the composition to a predetermined pattern of light of a type and in an amount sufficient to cause hydrosilylation reactions to occur in the composition;
  leaving an unexposed region;
  allowing sufficient time for hydrosilylation reactions to occur within exposed regions, thereby decreasing the solubility of the exposed regions such that the unexposed region is more soluble in a solvent than the exposed regions;
  using a solvent to remove the unexposed composition from the substrate, leaving the exposed composition on the substrate to provide a chemically selective sorbent film; and
  using the chemically selective sorbent film by exposing the film to a first chemical species that the film will selectively absorb.

55. The method of claim 54 where the catalyst is selected from the group consisting of platinum(II) bis(beta-diketonates).

56. The method of claim 54 wherein the second precursor molecule is selected from the group consisting of monomers, oligomers, polymers, and crosslinkers.

57. A chemical sensor prepared by the method of claim 54.

58. The method of claim 54, further comprising:
  placing on the substrate a second composition containing a first precursor molecule containing at least two silicon hydride groups, a second precursor molecule containing at least two carbon—carbon multiple bonds, and a photoactivatable catalyst;
  exposing at least a portion of said second composition to light of a type and in an amount sufficient to cause hydrosilylation reactions to occur in the second composition to provide a second chemically selective sorbent film;
  leaving an unexposed region of the second composition;
  allowing sufficient time for hydrosilylation reactions to occur within exposed regions of the second composition; and
  removing the unexposed region of the second composition from the substrate, leaving the exposed region of the second composition on the substrate, by contacting the composition with a solvent effective to dissolve the unexposed composition.

59. The method of claim 58 wherein the first chemically selective sorbent film has a different pattern or is at a different location than the second chemically selective sorbent film.

60. The method of 58 wherein the first chemically selective sorbent film has a different functionality than the second chemically selective sorbent film.

61. The method of claim 58, further comprising repeating said placing, exposing, leaving, allowing and removing one or more additional times with one or more additional compositions.

62. The method of claim 54, wherein at least one of the first and second precursor molecules is selected based upon its having a chemically interactive property that is retained after the hydrosilylation reactions, and that provides to the chemically selective sorbent film a functionality whereby the film selectively absorbs the first chemical species more than a second chemical species.

63. A method of forming a chemically selective sorbent film, comprising:
  providing a substrate;
  cleaning the substrate;
  reacting a coupling agent with the surface of said substrate that appends to the surface reactive groups that can participate in hydrosilylation reactions;
  placing on said substrate a composition containing a first precursor molecule containing at least two silicon hydride groups, a second precursor molecule containing at least two carbon—carbon multiple bonds, and a photoactivatable catalyst;
  exposing the composition to a predetermined pattern of light of a type and in an amount sufficient to cause hydrosilylation reactions to occur in the composition;
  leaving an unexposed region;
  allowing sufficient time for hydrosilylation reactions to occur within exposed regions, thereby decreasing the solubility of the exposed regions such that the unexposed region is more soluble in a solvent than the unexposed regions;
  using a solvent to remove the unexposed composition from the substrate, leaving the exposed composition on the substrate to provide a chemically selective sorbent film; and
  using the chemically selective sorbent film by exposing the film to a first chemical species that the film will selectively absorb.

64. The method of claim 63 wherein the coupling agent is selected from the group that appends silicon hydride or carbon—carbon multiple bonds to the surface.

65. The method of claim 64 wherein the coupling agent is selected from the group consisting of trialkoxysilane, trimethoxysilane, triethoxysilane, trichlorosilane, trialkoxyvinylsilane, trimethoxyvinylsilane, triethoxyvinylsilane, and trichlorovinylsilane, alkoxydimethylsilanes, and alkoxydimethylvinylsilanes.

66. The method of claim 63 where the catalyst is platinum (II) bis(acetylacetonate).

67. The method of claim 63 wherein the second precursor molecule is selected from the group consisting of monomers, oligomers, polymers, and crosslinkers.

68. The method of claim 67 where the second precursor molecule is a crosslinker containing more than two carbon—carbon multiple bonds.

69. The method of claim 68 where the crosslinker is selected from the group consisting of molecules with more than two vinylsiloxy groups, molecules with more than two vinylsilane groups, molecules with more than two vinyldimethylsiloxy groups, and molecules with more than two vinylmethylphenylsiloxy groups.

70. The method of claim 63 where the second precursor molecule is an organic molecule with two allyl groups.

71. A chemical sensor prepared by the method of claim 63.

72. The method of claim 63, wherein at least one of the first and second precursor molecules is selected based upon its having a chemically interactive property that is retained after the hydrosilylation reactions, and that provides to the chemically selective sorbent film a functionality whereby the film selectively absorbs the first chemical species more than a second chemical species.

73. A method of forming several individual domains of chemically selective sorbent films on a single substrate comprising:
providing a substrate;
cleaning the substrate;
reacting a coupling agent with the surface of said substrate that appends to the surface reactive groups that can participate in hydrosilylation reactions;
placing on a substrate a first composition containing a first precursor molecule containing at least two silicon hydride groups, a second precursor molecule containing at least two carbon—carbon multiple bonds, and a photoactivatable catalyst;
exposing the composition to a predetermined pattern of light of a type and in an amount sufficient to cause hydrosilylation reactions to occur in the composition;
leaving an unexposed region;
allowing sufficient time for hydrosilylation reactions to occur within exposed regions;
and using a solvent to remove the unexposed composition from the substrate, leaving the exposed composition on the substrate;
placing on the substrate a second composition containing a first precursor molecule containing at least two silicon hydride groups, a second precursor molecule containing at least two carbon—carbon multiple bonds, and a photoactivatable catalyst;
exposing the composition to a predetermined pattern of light of a type and in an amount sufficient to cause hydrosilylation reactions to occur in the second composition at a different location on the substrate from the first composition;
leaving an unexposed region;
allowing sufficient time for hydrosilylation reactions to occur within exposed regions; and using a solvent to remove the unexposed composition from the substrate, leaving the exposed composition on the substrate;
repeating the process with additional new compositions at additional different locations;
whereby the substrate contains separate domains of different chemically selective sorbent films.

74. A method comprising:
making a chemical sensor by:
providing a clean substrate;
reacting a coupling agent with the surface of said substrate, said coupling agent including a reactive group selected from the group consisting of a silicon hydride group, a carbon—carbon multiple bond, and each of a silicon hydride group and a carbon—carbon multiple bond;
placing on the substrate a composition containing a first precursor molecule containing at least two silicon hydride groups, a second precursor molecule containing at least two carbon—carbon multiple bonds, and a photoactivatable catalyst;
exposing the composition to a predetermined pattern of light of a type and in an amount sufficient to cause hydrosilylation reactions to occur in regions of the composition exposed to the light;
allowing sufficient time for hydrosilylation reactions to occur within the exposed regions; and
removing the unexposed composition from the substrate, leaving the exposed composition on the substrate, by contacting the composition with a solvent effective to dissolve the unexposed composition, to thereby provide a chemically selective sorbent film.

75. The method of claim 74 wherein the chemically selective sorbent film has a glass-to-rubber transition temperature below the operating temperature of the chemical sensor.

76. The method of claim 74, further comprising repeating said placing, exposing, allowing and removing with a second composition to provide a second chemically selective sorbent film on the substrate.

77. The method of claim 76 wherein the first chemically selective sorbent film has a different pattern or is at a different location than the second chemically selective sorbent film.

78. The method of 76 wherein the first chemically selective sorbent film has a different functionality than the second chemically selective sorbent film.

79. The method of claim 76, further comprising repeating said placing, exposing, allowing and removing one or more additional times with one or more additional compositions.

80. A method of forming several individual domains of chemically selective sorbent films on a single substrate comprising:
providing a substrate;
placing on a substrate a first composition containing a first precursor molecule containing at least two silicon hydride groups, a second precursor molecule containing at least two carbon—carbon multiple bonds, and a photoactivatable catalyst;
exposing the composition to a predetermined pattern of light of a type and in an amount sufficient to cause hydrosilylation reactions to occur in the composition;
leaving an unexposed region;
allowing sufficient time for hydrosilylation reactions to occur within exposed regions;
and using a solvent to remove the unexposed composition from the substrate, leaving the exposed composition on the substrate;

placing on the substrate a second composition containing a first precursor molecule containing at least two silicon hydride groups, a second precursor molecule containing at least two carbon—carbon multiple bonds, and a photoactivatable catalyst;

exposing the composition to a predetermined pattern of light of a type and in an amount sufficient to cause hydrosilylation reactions to occur in the second composition at a different location on the substrate from the first composition;

leaving an unexposed region;

allowing sufficient time for hydrosilylation reactions to occur within exposed regions; and using a solvent to remove the unexposed composition from the substrate, leaving the exposed composition on the substrate;

whereby the substrate contains separate domains of different chemically selective sorbent films.

81. A method of forming a chemically selective sorbent film, comprising:

determining that at least one of a first and second precursor molecule has a chemically interactive property that is retained after a chemically selective sorbent film is formed by a hydrosilylation reaction between said first and second precursor molecules and that provides to the film a functionality whereby the film selectively absorbs a first chemical species more than a second chemical species, wherein the first precursor molecule contains at least two silicon hydride groups and the second precursor molecule contains at least two carbon—carbon multiple bonds;

based on the determining placing on a substrate a composition that includes the first precursor molecule, the second precursor molecule and a photoactivatable catalyst;

exposing the composition to a predetermined pattern of light of a type and in an amount sufficient to cause hydrosilylation reactions to occur in the composition;

leaving an unexposed region;

allowing sufficient time for hydrosilylation reactions to occur within exposed regions, thereby decreasing the solubility of the exposed regions such that the unexposed region is more soluble in a solvent than the exposed regions; and using a solvent to remove the unexposed composition from the substrate, leaving the exposed composition on the substrate to provide a chemically selective sorbent film.

82. The method of claim 81, further comprising leaving the chemically selective sorbent film in place on the substrate for subsequent use to selectively absorb a first chemical species to which the film is exposed.

83. A method of forming a chemically selective sorbent film, comprising:

determining that at least one of a first and second precursor molecule has a chemically interactive property that is retained after a chemically selective sorbent film is formed by a hydrosilylation reaction between said first and second precursor molecules and that provides to the film a functionality whereby the film selectively absorbs a first chemical species more than a second chemical species, wherein the first precursor molecule contains at least two silicon hydride groups and the second precursor molecule contains at least two carbon-carbon multiple bonds;

providing a substrate;

cleaning the substrate;

reacting a coupling agent with the surface of said substrate that appends to the surface reactive groups that can participate in hydrosilylation reactions;

based on the determining placing on said substrate a composition that includes the first precursor molecule, the second precursor molecule and a photoactivatable catalyst;

exposing the composition to a predetermined pattern of light of a type and in an amount sufficient to cause hydrosilylation reactions to occur in the composition;

leaving an unexposed region;

allowing sufficient time for hydrosilylation reactions to occur within exposed regions, thereby decreasing the solubility of the exposed regions such that the unexposed region is more soluble in a solvent than the exposed regions; and using a solvent to remove the unexposed composition from the substrate, leaving the exposed composition on the substrate to provide a chemically selective sorbent film.

84. The method of claim 83, further comprising leaving the chemically selective sorbent film in place on the substrate for subsequent use to selectively absorb a first chemical species to which the film is exposed.

85. A method of performing an analytical function, comprising:

providing an analytical device made by placing on a substrate a composition containing a first precursor molecule containing at least two silicon hydride groups, a second precursor molecule containing at least two carbon—carbon multiple bonds, and a photoactivatable catalyst;

exposing the composition to a predetermined pattern of light of a type and in an amount sufficient to cause hydrosilylation reactions to occur in the composition; leaving an unexposed region; allowing sufficient time for hydrosilylation reactions to occur within exposed regions, thereby decreasing the solubility of the exposed regions such that the unexposed region is more soluble in a solvent than the exposed regions; and using a solvent to remove the unexposed composition from the substrate, leaving the exposed composition on the substrate to provide a chemically selective sorbent film; and using the device by exposing the film to a first chemical species that the film will selectively absorb.

86. The method of claim 85 wherein at least one of the first and second precursor molecules is selected based upon its having a chemically interactive property that is retained after the hydrosilylation reactions, and that provides to the chemically selective sorbent film a functionality whereby the film selectively absorbs the first chemical species more than a second chemical species.

87. A method of performing an analytical function, comprising:

providing an analytical device made by providing a substrate; cleaning the substrate;

reacting a coupling agent with the surface of said substrate that appends to the surface reactive groups that can participate in hydrosilylation reactions; placing on said substrate a composition containing a first precursor molecule containing at least two silicon hydride groups, a second precursor molecule containing at least two carbon—carbon multiple bonds, and a photoactivatable catalyst; exposing the composition to a predetermined pattern of light of a type and in an amount sufficient to cause hydrosilylation reactions to occur in the composition; leaving an unexposed region; allowing sufficient time for hydrosilylation reactions to occur within exposed regions, thereby decreasing the solubility of the exposed regions such that the unexposed region is more soluble in a solvent than the exposed regions; and using a solvent to remove the unexposed composition from the substrate, leaving the exposed composition on the substrate to provide a chemically selective sorbent film; and using the device by exposing the film to a first chemical species that the film will selectively absorb.

88. The method of claim 87 wherein at least one of the first and second precursor molecules is selected based upon its having a chemically interactive property that is retained after the hydrosilylation reactions, and that provides to the chemically selective sorbent film a functionality whereby the film selectively absorbs the first chemical species more than a second chemical species.

89. A method comprising:
manufacturing an analytical device that is selective for one or more chemical species by:
placing on a substrate a composition containing a first precursor molecule containing at least two silicon hydride groups, a second precursor molecule containing at least two carbon—carbon multiple bonds, and a photoactivatable catalyst;
exposing the composition to a predetermined pattern of light of a type and in an amount sufficient to cause hydrosilylation reactions to occur in the composition;
leaving an unexposed region; allowing sufficient time for hydrosilylation reactions to occur within exposed regions, thereby decreasing the solubility of the exposed regions such that the unexposed region is more soluble in a solvent than the exposed regions; and
using a solvent to remove the unexposed composition from the substrate, leaving the exposed composition on the substrate to provide a chemically selective sorbent film.

90. The method of claim 89, further comprising leaving the chemically selective sorbent film in place on the substrate for subsequent use to selectively absorb a first chemical species to which the film is exposed.

91. The method of claim 89 wherein at least one of the first and second precursor molecules is selected based upon its having a chemically interactive property that is retained after the hydrosilylation reactions, and that provides to the chemically selective sorbent film a functionality whereby the film selectively absorbs a first chemical species more than a second chemical species.

92. The method of claim 89 wherein the analytical device has a predetermined functionality.

93. A method comprising:
manufacturing an analytical device that is selective for one or more chemical species by:
providing a substrate;
cleaning the substrate;
reacting a coupling agent with the surface of said substrate that appends to the surface reactive groups that can participate in hydrosilylation reactions;
placing on said substrate a composition containing a first precursor molecule containing at least two silicon hydride groups, a second precursor molecule containing at least two carbon—carbon multiple bonds, and a photoactivatable catalyst;
exposing the composition to a predetermined pattern of light of a type and in an amount sufficient to cause hydrosilylation reactions to occur in the composition;
leaving an unexposed region;
allowing sufficient time for hydrosilylation reactions to occur within exposed regions, thereby decreasing the solubility of the exposed regions such that the unexposed region is more soluble in a solvent than the exposed regions; and
using a solvent to remove the unexposed composition from the substrate, leaving the exposed composition on the substrate to provide a chemically selective sorbent film.

94. The method of claim 93, further comprising leaving the chemically selective sorbent film in place on the substrate for subsequent use to selectively absorb a first chemical species to which the film is exposed.

95. The method of claim 93 wherein at least one of the first and second precursor molecules is selected based upon its having a chemically interactive property that is retained after the hydrosilylation reactions, and that provides to the chemically selective sorbent film a functionality whereby the film selectively absorbs a first chemical species more than a second chemical species.

96. The method of claim 93 wherein the analytical device has a predetermined functionality.

* * * * *

UNITED STATES PATENT AND TRADEMARK OFFICE
CERTIFICATE OF CORRECTION

PATENT NO.     : 6,991,887 B1
DATED          : January 31, 2006
INVENTOR(S)    : Grate et al.

It is certified that error appears in the above-identified patent and that said Letters Patent is hereby corrected as shown below:

<u>Title page,</u>
Item [75], Inventors, should read: -- Jay W. Grate, West Richland, WA (US);
                                      David A. Nelson, Richland, WA (US);
                                      Glen C. Dunham, Kennewick, WA (US) --.

Signed and Sealed this

Twenty-third Day of May, 2006

JON W. DUDAS
*Director of the United States Patent and Trademark Office*